(12) United States Patent
Akimoto

(10) Patent No.: US 9,130,043 B2
(45) Date of Patent: Sep. 8, 2015

(54) SEMICONDUCTOR DEVICE AND METHOD FOR MANUFACTURING THE SAME

(75) Inventor: Kengo Akimoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 753 days.

(21) Appl. No.: 12/893,513

(22) Filed: Sep. 29, 2010

(65) Prior Publication Data

US 2011/0079777 A1 Apr. 7, 2011

(30) Foreign Application Priority Data

Oct. 1, 2009 (JP) ................................ 2009-229323

(51) Int. Cl.
*H01L 29/786* (2006.01)
*H01L 27/12* (2006.01)

(52) U.S. Cl.
CPC ......... *H01L 29/7869* (2013.01); *H01L 27/1225* (2013.01)

(58) Field of Classification Search
None
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,048,644 A * | 4/2000 | Tsuji et al. ................ | 429/218.2 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,122,445 B2 | 10/2006 | Takayama et al. | |
| 7,211,825 B2 | 5/2007 | Shih et al | |
| 7,282,782 B2 | 10/2007 | Hoffman et al. | |

(Continued)

FOREIGN PATENT DOCUMENTS

| | | |
|---|---|---|
| EP | 1737044 A1 | 12/2006 |
| EP | 2226847 A2 | 9/2010 |

(Continued)

OTHER PUBLICATIONS

M.W.J. Prins et al.; "A ferroelectric transparent thin-film transistor"; Appl. Phys. Lett. (Applied Physics Letters), Jun. 17, 1996; vol. 68, No. 25; pp. 3650-3652.

(Continued)

*Primary Examiner* — Tan N Tran
*Assistant Examiner* — Scott R Wilson
(74) *Attorney, Agent, or Firm* — Fish & Richardson P.C.

(57) ABSTRACT

An object is to provide a method for manufacturing a highly reliable semiconductor device which includes a thin film transistor using an oxide semiconductor and having stable electric characteristics. In manufacture of a semiconductor device in which an oxide semiconductor is used for a channel formation region, after an oxide semiconductor film is formed, a conductive film including a metal, a metal compound, or an alloy that can absorb or adsorb moisture, a hydroxy group, or hydrogen is formed to overlap with the oxide semiconductor film with an insulating film provided therebetween. Then, heat treatment is performed in the state where the conductive film is exposed; in such a manner, activation treatment for removing moisture, oxygen, hydrogen, or the like adsorbed onto a surface of or in the conductive film is performed.

27 Claims, 17 Drawing Sheets

(56) References Cited

U.S. PATENT DOCUMENTS

| | | |
|---|---|---|
| 7,297,977 B2 | 11/2007 | Hoffman et al. |
| 7,323,356 B2 | 1/2008 | Hosono et al. |
| 7,375,006 B2 | 5/2008 | Takayama et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,666,719 B2 | 2/2010 | Takayama et al. |
| 7,674,650 B2 | 3/2010 | Akimoto et al. |
| 7,732,819 B2 | 6/2010 | Akimoto et al. |
| 7,842,989 B2 | 11/2010 | Kato |
| 7,893,431 B2 | 2/2011 | Kim et al. |
| 8,384,077 B2 | 2/2013 | Yano et al. |
| 8,421,070 B2 | 4/2013 | Kim et al. |
| 8,735,882 B2 | 5/2014 | Kim et al. |
| 2001/0045563 A1 | 11/2001 | Kusumoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2003/0224582 A1 | 12/2003 | Shimoda et al. |
| 2004/0038446 A1 | 2/2004 | Takeda et al. |
| 2004/0127038 A1 | 7/2004 | Carcia et al. |
| 2004/0184027 A1* | 9/2004 | Mizutani et al. ............... 356/71 |
| 2005/0017302 A1 | 1/2005 | Hoffman |
| 2005/0199959 A1 | 9/2005 | Chiang et al. |
| 2005/0199960 A1* | 9/2005 | Hoffman et al. ............. 257/368 |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0188385 A1* | 8/2006 | Mukai et al. ................ 420/455 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0196962 A1* | 8/2007 | Morisue et al. .............. 438/149 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299702 A1 | 12/2008 | Son et al. |
| 2009/0068773 A1 | 3/2009 | Lai et al. |
| 2009/0073325 A1 | 3/2009 | Kuwabara et al. |
| 2009/0090914 A1 | 4/2009 | Yano et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0206381 A1* | 8/2009 | Shin et al. ...................... 257/300 |
| 2009/0278122 A1 | 11/2009 | Hosono et al. |
| 2009/0280600 A1 | 11/2009 | Hosono et al. |
| 2010/0003601 A1* | 1/2010 | Niessen et al. ................ 429/219 |
| 2010/0053486 A1* | 3/2010 | Shim et al. ...................... 349/39 |
| 2010/0065844 A1 | 3/2010 | Tokunaga |
| 2010/0072583 A1 | 3/2010 | Oikawa et al. |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0244022 A1* | 9/2010 | Takahashi et al. .............. 257/43 |
| 2013/0146452 A1 | 6/2013 | Yano et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000-269505 A | 9/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-311404 A | 11/2007 |
| JP | 2008-281988 A | 11/2008 |
| JP | 2009-099847 A | 5/2009 |
| JP | 2009-164473 A | 7/2009 |
| JP | 2009-176865 A | 8/2009 |
| JP | 2009-533884 | 9/2009 |
| WO | 2004/114391 A1 | 12/2004 |
| WO | WO-2007/120010 | 10/2007 |
| WO | 2008/126879 A1 | 10/2008 |
| WO | WO-2009/075281 | 6/2009 |
| WO | 2009/093722 A1 | 7/2009 |

OTHER PUBLICATIONS

Noburo Kimizuka et al.; "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System"; Journal of Solid State Chemistry; Apr. 1, 1995; vol. 116, No. 1; pp. 170-178.

Masaki Nakamura et al.; "The phase relations in the In2O3—Ga2ZnO4—ZnO system at 1350° C."; Journal of Solid State Chemistry; Aug. 1, 1991; vol. 93, No. 2; pp. 298-315.

(56) References Cited

OTHER PUBLICATIONS

Masaki Nakamura et al.; "Syntheses and crystal structures of new homologous compounds, indium iron zinc oxides (InFeO3(ZnO)m) (m natural number) and related compounds"; Kotai Butsuri (Solid State Physics); 1993; vol. 28, No. 5; pp. 317-327 (with full English translation).

Kenji Nomura et al.; "Thin-Film Transistor Fabricated in Single-Crystalline Transparent Oxide Semiconductor"; Science; May 23, 2003; vol. 300, No. 5623; pp. 1269-1272.

Kenji Nomura et al.; "Room-temperature fabrication of transparent flexible thin-film transistors using amorphous oxide semiconductors"; Nature; Nov. 25, 2004; vol. 432; pp. 488-492.

International Search Report, PCT Application No. PCT/JP2010/065675, dated Nov. 30, 2010, 3 pages.

Written Opinion, PCT Application No. PCT/JP2010/065675, dated Nov. 30, 2010, 5 pages.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters) , Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters) , 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

(56) References Cited

OTHER PUBLICATIONS

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems,", Journal of Solid-State Circuits , 2008, vol. 43, No. 1, pp. 292-299.

Lany, S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Lee, H et al., "Current Status of, Challenges to, and Perspective View of AM-OLED ,", IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics) , Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor,", Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Taiwanese Office Action (Application No.099133313) Dated Apr. 13, 2015.

* cited by examiner 203 206 201 204

211 206 208

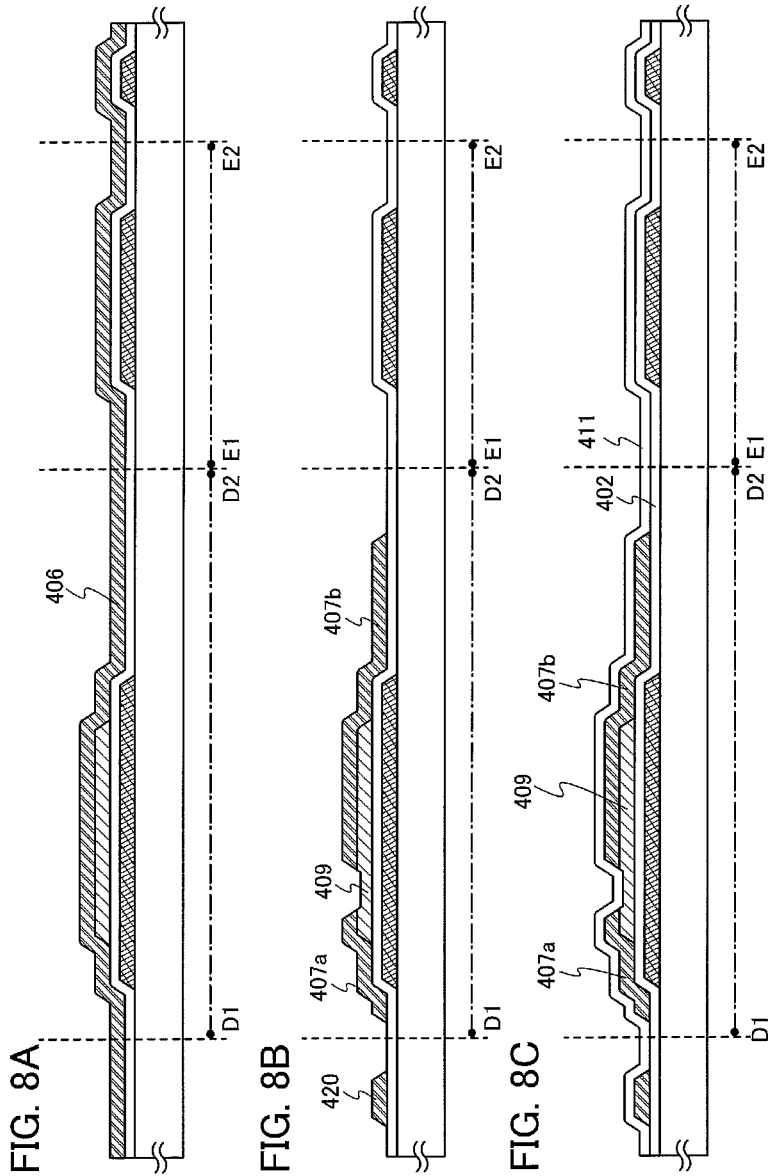

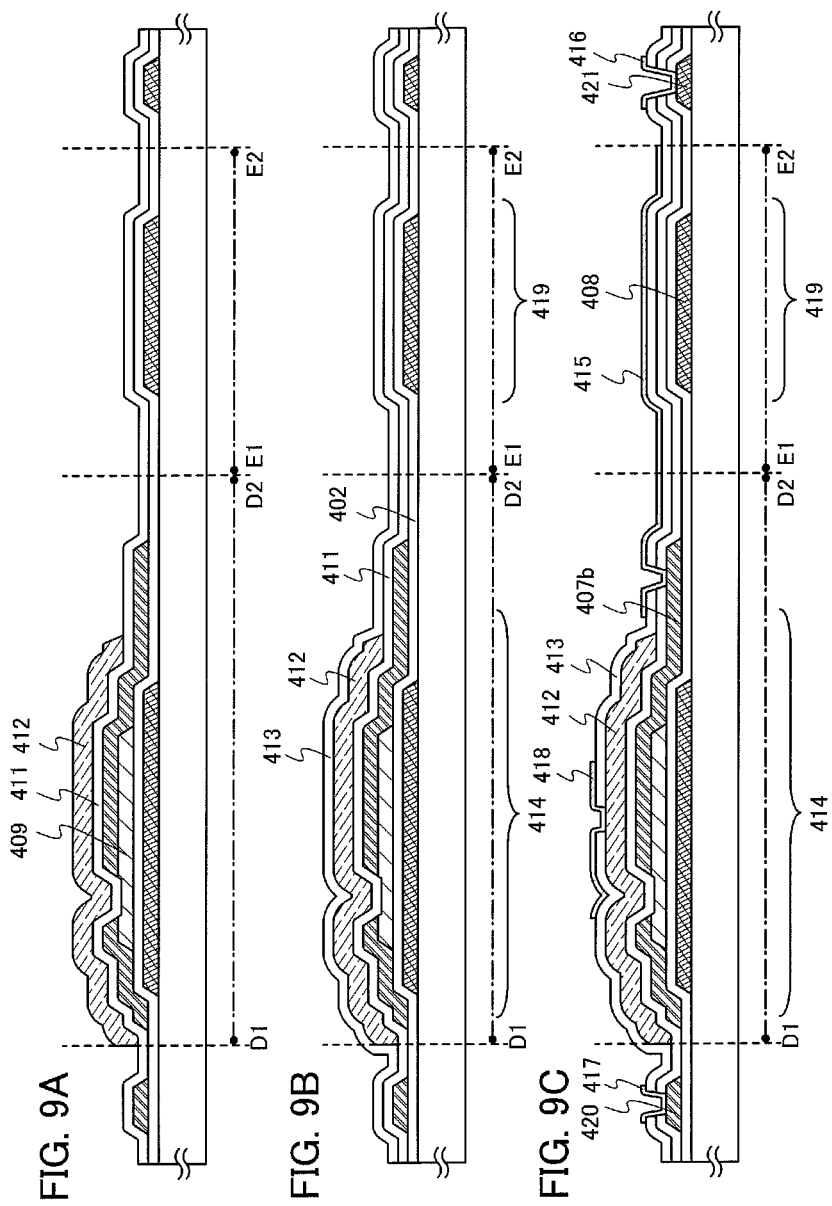

FIG. 10
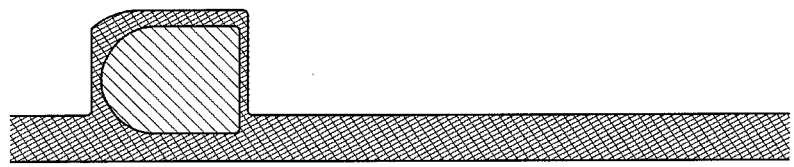
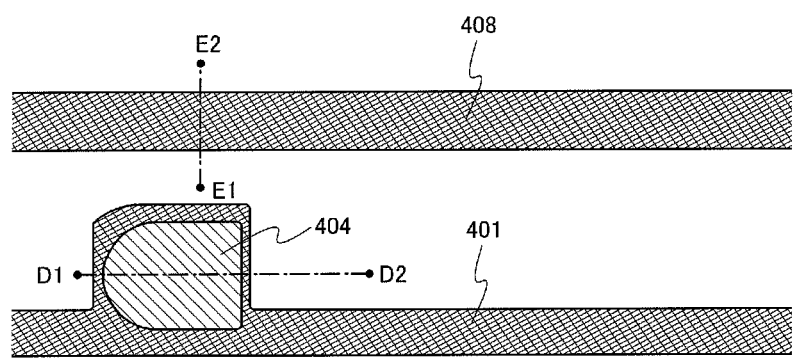
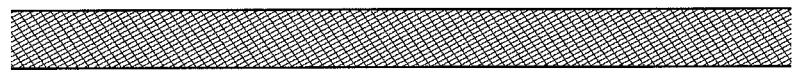

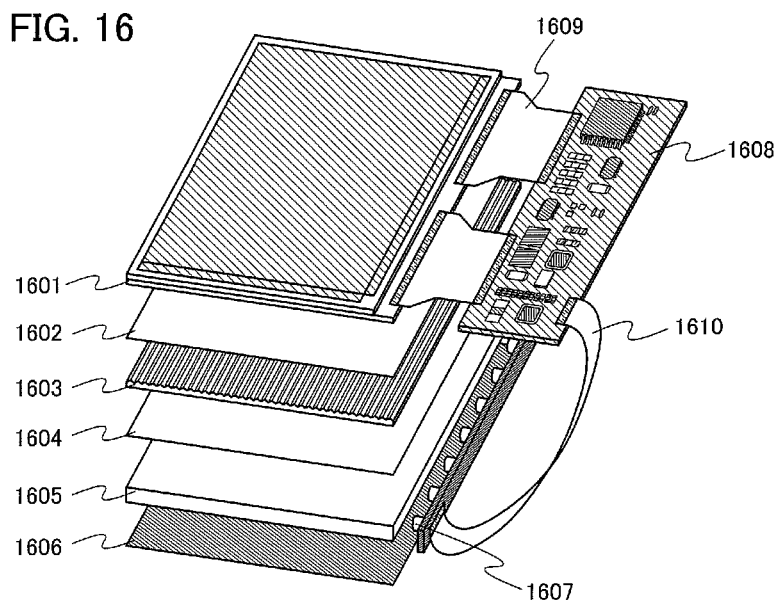

SEMICONDUCTOR DEVICE AND METHOD FOR MANUFACTURING THE SAME

TECHNICAL FIELD

The present invention relates to a semiconductor device including an oxide semiconductor and a manufacturing method thereof.

BACKGROUND ART

A thin film transistor in which a semiconductor film is formed on an insulating surface is a semiconductor element that is essential to a flat panel display such as a liquid crystal display device or a light-emitting device and a semiconductor device such as an IC. Since there is limitation on manufacture of a thin film transistor in terms of allowable temperature limit of a substrate, a thin film transistor in which amorphous silicon that can be deposited at relatively low temperature, polysilicon that can be obtained by crystallization with use of laser light or a catalytic element, or the like is included in an active layer is mainly used for a semiconductor display device.

In recent years, as a novel semiconductor material which has a mobility as high as polysilicon and realizes such uniform element characteristics as are obtained with the use of amorphous silicon, a metal oxide having semiconductor characteristics which is called an oxide semiconductor has attracted attention. A metal oxide is used for various applications. For example, indium oxide is a well-known metal oxide and used as a transparent electrode material included in a liquid crystal display device or the like. Examples of such metal oxides having semiconductor characteristics include tungsten oxide, tin oxide, indium oxide, and zinc oxide. Thin film transistors including such metal oxide having semiconductor characteristics in its channel formation region have been proposed (Patent Documents 1 to 4 and Non-Patent Document 1).

As metal oxides, multi-component oxides as well as single-component oxides are known. For example, $InGaO_3(ZnO)_m$ (m: natural number) having a homologous series is known as a multi-component oxide semiconductor including In, Ga, and Zn (Non-Patent Documents 2 to 4). Furthermore, it is confirmed that an oxide semiconductor including such an In—Ga—Zn-based oxide is applicable to a channel layer of a thin film transistor (Patent Document 5, Non-Patent Documents 5 and 6).

REFERENCE

Patent Document

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", Appl. Phys. Lett., 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", J. Solid State Chem., 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", KOTAI BUTSURI (SOLID STATE PHYSICS), 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", SCIENCE, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", NATURE, 2004, Vol. 432, pp. 488-492

DISCLOSURE OF INVENTION

Variation in the threshold voltage due to time degradation is required to be small for a transistor included in a driver circuit of a flat panel display or a transistor used as a switching element of a pixel. An object of the present invention is to provide a method for manufacturing a highly reliable semiconductor device which includes a thin film transistor using an oxide semiconductor and having stable electric characteristics. Another object of the present invention is to provide a highly reliable semiconductor device which includes a thin film transistor using an oxide semiconductor and having stable electric characteristics.

In manufacture of a semiconductor device including a transistor in which an oxide semiconductor is used for a channel formation region, after an oxide semiconductor film is formed, a conductive film including a metal, a metal compound, or an alloy that can absorb or adsorb moisture, a hydroxy group, or hydrogen is formed to overlap with the oxide semiconductor film with an insulating film provided therebetween. Then, heat treatment under a reduced-pressure atmosphere or an inert gas atmosphere is performed in the state where the conductive film is exposed; in such a manner, activation treatment for removing moisture, oxygen, hydrogen, or the like adsorbed onto a surface of or in the conductive film is performed. The heat treatment is performed at 350° C. to 650° C. By the above activation treatment, impurities such as moisture, a hydroxy group, or hydrogen which are present in the oxide semiconductor film, in a gate insulating film, or at the interface between the oxide semiconductor film and another insulating film and its vicinity are absorbed or adsorbed by the conductive film which has been activated; therefore, deterioration in characteristics of the transistor due to the impurities can be prevented.

After the activation treatment, an insulating film is formed so as to cover the conductive film, whereby moisture and oxygen in the atmosphere can be prevented from being adsorbed onto the surface of or in the conductive film; therefore, the conductive film can be kept to be activated, and reliability of the transistor can be increased.

The conductive film can be formed using one or more metals that easily absorb or adsorb moisture, a hydroxy group, or hydrogen. Specifically, as a metal having the above characteristics, titanium, platinum, vanadium, zirconium, hafnium, palladium, magnesium, niobium, a rare earth metal, or the like can be given. As the rare earth metal, an alloy including cerium (40% to 50%), lanthanum (20% to 40%), and a rare earth metal such as praseodymium, neodymium, or yttrium, which is called a misch metal (Mm), can also be used. The conductive film may be a mixture, a metal compound, or an alloy which includes one or more of the above metals.

The conductive film may be used as a gate electrode of the thin film transistor, or may be used as a source electrode or a drain electrode of the thin film transistor. Alternatively, the conductive film may be used as a back gate electrode which is formed to overlap with a gate electrode with the oxide semiconductor film provided therebetween.

In order to reduce impurities such as moisture, a hydroxy group, and hydrogen in the oxide semiconductor film, after the oxide semiconductor film is formed, heat treatment is performed under an inert gas atmosphere such as a nitrogen atmosphere or a rare gas (e.g., argon or helium) atmosphere in the state where the oxide semiconductor film is exposed. The heat treatment is preferably performed at 400° C. or higher and lower than the temperature at which an oxide semiconductor is almost crystallized (i.e., lower than 700° C.). Note that this heat treatment is performed at a temperature not exceeding the allowable temperature limit of the substrate to be used.

As the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, an In—O-based oxide semiconductor, a Sn—O-based oxide semiconductor, a Zn—O-based oxide semiconductor, or the like can be used. Note that in this specification, for example, an In—Sn—Ga—Zn—O-based oxide semiconductor means a metal oxide including indium (In), tin (Sn), gallium (Ga), and zinc (Zn). There is no particular limitation on the stoichiometric proportion. The above oxide semiconductor may include silicon.

Moreover, oxide semiconductors can be represented by the chemical formula, $InMO_3(ZnO)_m$ (m>0). Here, M represents one or more metal elements selected from Ga, Al, Mn, or Co.

Note that the resistance of the oxide semiconductor film is reduced by the heat treatment. After that, an oxide insulating film is formed in contact with the low-resistance oxide semiconductor film, whereby the carrier concentration of at least a region in the low-resistance oxide semiconductor film in contact with the oxide insulating film is reduced (preferably to lower than $1\times10^{18}/cm^3$, more preferably to $1\times10^{14}/cm^3$ or lower), so that the resistance of at least the region is increased. As described above, in a manufacturing process of a semiconductor device, the carrier concentration and resistance of the oxide semiconductor film can be controlled by formation of the oxide insulating film or the like, so that a semiconductor device which includes a thin film transistor with favorable electric characteristics and high reliability can be manufactured and provided.

Note that as the oxide insulating film formed to be in contact with the low-resistance oxide semiconductor film, an inorganic insulating film which blocks impurities such as moisture, hydrogen ions, and OH⁻ is used. Specifically, a silicon oxide film or a silicon nitride oxide film is used.

The transistor may be a bottom-gate transistor, a top-gate transistor, or a bottom-contact transistor. The bottom-gate transistor includes, for example, a gate electrode over an insulating surface; a gate insulating film over the gate electrode; an oxide semiconductor film overlapping with the gate electrode with the gate insulating film provided therebetween; a source electrode and a drain electrode over the oxide semiconductor film; an oxide insulating film over the oxide semiconductor film, the source electrode, and the drain electrode; and a back gate electrode overlapping with the oxide semiconductor film with the oxide insulating film provided therebetween. The top-gate transistor includes, for example, an oxide semiconductor film over an insulating surface; a gate insulating film which is an oxide insulating film over the oxide semiconductor film; and a gate electrode overlapping with the oxide semiconductor film with the gate insulating film provided therebetween and functioning as a conductive film. The bottom-contact transistor includes, for example, a gate electrode over an insulating surface; a gate insulating film over the gate electrode; a source electrode and a drain electrode over the gate insulating film; an oxide semiconductor film which is over the source electrode and the drain electrode and overlaps with the gate electrode with the gate insulating film provided therebetween; an oxide insulating film over the oxide semiconductor film; and a back gate electrode overlapping with the oxide semiconductor film with the oxide insulating film provided therebetween.

Heat treatment in a furnace or a rapid thermal annealing method (RTA method) is used for the heat treatment. As the RTA method, a method using a lamp light source or a method in which a substrate is moved in a heated gas and heat treatment is performed for a short time can be employed. With the use of the RTA method, it is also possible to make the time necessary for heat treatment shorter than 0.1 hour. Note that in the case where a glass substrate is used as a substrate, heat treatment is performed at higher than or equal to 300° C. and lower than or equal to the strain point of the glass substrate.

A thin film transistor having stable electric characteristics can be manufactured and provided. In addition, a semiconductor device which includes a highly reliable thin film transistor having favorable electric characteristics can be provided.

BRIEF DESCRIPTION OF DRAWINGS

FIGS. 8A to 8C illustrate a method for manufacturing a semiconductor device.

FIGS. 9A to 9C illustrate a method for a manufacturing a semiconductor device.

FIG. 10 illustrates a method for manufacturing a semiconductor device.

FIG. 16 illustrates a structure of a liquid crystal display device module.

BEST MODE FOR CARRYING OUT THE INVENTION

Embodiments and an example of the present invention will be hereinafter described in detail with reference to the accompanying drawings. Note that the present invention is not limited to the description below, and those skilled in the art will appreciate that a variety of modifications can be made to the modes and details without departing from the spirit and scope of the present invention. Therefore, the present invention is not construed as being limited to the description of embodiments and an example below.

The present invention can be applied to manufacture of any kind of semiconductor devices including microprocessors, integrated circuits such as image processing circuits, RF tags, semiconductor display devices, and the like. A semiconductor device means any device which can function by utilizing semiconductor characteristics, and a semiconductor display device, a semiconductor circuit, and an electronic device are all included in the category of the semiconductor device. The semiconductor display devices include the following in its category: liquid crystal display devices, light-emitting devices in which a light-emitting element typified by an organic light-emitting element (OLED) is provided for each pixel, electronic papers, digital micromirror devices (DMDs), plasma display panels (PDPs), field emission displays (FEDs), and other semiconductor display devices in which a circuit element using a semiconductor film is included in a driver circuit.

Embodiment 1

A method for manufacturing a semiconductor device will be described with reference to FIGS. 1A to 1E and FIGS. 2A and 2B with use of a bottom-gate thin film transistor as an example.

Figure 1A:
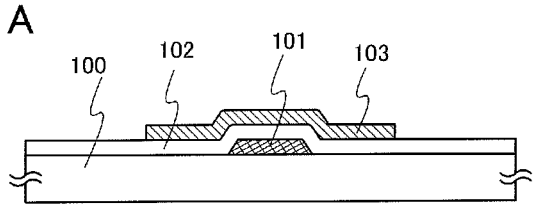
FIGS. 1A to 1E illustrate a method for manufacturing a semiconductor device.

As illustrated in FIG. 1A, a gate electrode 101 is formed over a substrate 100 having an insulating surface. An insulating film serving as a base film may be provided between the substrate 100 and the gate electrode 101. The base film can be formed to have a single-layer structure or a stacked-layer structure using one or more insulating films which prevent diffusion of impurity elements from the substrate 100, specifically, a silicon nitride film, a silicon oxide film, a silicon nitride oxide film, or a silicon oxynitride film. The gate electrode 101 can be formed to have a single-layer structure or a stacked-layer structure using one or more conductive films using a metal material such as molybdenum, titanium, chromium, tantalum, tungsten, neodymium, or scandium; an alloy material which contains any of these metal materials as its main component; or a nitride which contains any of these metals. Note that aluminum or copper can also be used as the above metal material as long as it can withstand the temperature of heat treatment performed later.

For example, as a two-layer structure of the gate electrode 101, a two-layer structure in which a titanium nitride film and a molybdenum film are stacked is preferable. As a three-layer structure of the gate electrode 101, a three-layer structure in which a tungsten film or a tungsten nitride film, an aluminum-silicon alloy film or an aluminum-titanium alloy film, and a titanium nitride film or a titanium film are stacked is preferable.

Note that in this specification, an oxynitride is a substance that contains more oxygen than nitrogen, and a nitride oxide is a substance that contains more nitrogen than oxygen.

The gate electrode 101 is formed to a thickness of 10 nm to 400 nm, preferably 100 nm to 200 nm. In this embodiment, a conductive film for the gate electrode is formed to a thickness of 150 nm by a sputtering method using a tungsten target, and then, the conductive film is processed (patterned) into a desired shape by etching; in such a manner, the gate electrode 101 is formed.

Next, a gate insulating film 102 is formed over the gate electrode 101. The gate insulating film 102 can be formed to have a single-layer structure or a stacked-layer structure of a silicon oxide film, a silicon nitride film, a silicon oxynitride film, and/or a silicon nitride oxide film by a plasma CVD method, a sputtering method, or the like. For example, a silicon oxynitride film may be formed using a deposition gas including silane (for example, monosilane), oxygen, and nitrogen by a plasma CVD method.

In this embodiment, the gate insulating film 102 is formed to a thickness of 200 nm by a plasma CVD method. The gate insulating film 102 is formed under the following conditions: the flow rate of a silane gas is 4 sccm; the flow rate of dinitrogen monoxide ($N_2O$) is 800 sccm; and the substrate temperature is 400° C.

Next, an oxide semiconductor film is formed over the gate insulating film 102. The oxide semiconductor film is formed by a sputtering method using an oxide semiconductor target. Moreover, the oxide semiconductor film can be formed by a sputtering method under a rare gas (for example, argon) atmosphere, an oxygen atmosphere, or an atmosphere including a rare gas (for example, argon) and oxygen.

Note that before the oxide semiconductor film is formed by a sputtering method, dust attached to a surface of the gate insulating film 102 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

The oxide semiconductor film for forming a channel formation region may be formed using an oxide material having semiconductor characteristics described above.

The thickness of the oxide semiconductor film is set to 5 nm to 300 nm, preferably 10 nm to 100 nm. In this embodiment, as the oxide semiconductor film, an In—Ga—Zn—O-based non-single-crystal film with a thickness of 50 nm, which is obtained by a sputtering method using an oxide semiconductor target including indium (In), gallium (Ga), and zinc (Zn) ($In_2O_3:Ga_2O_3:ZnO=1:1:1$), is used. In this embodiment, a DC sputtering method is employed, the flow rate of argon is 30 sccm, the flow rate of oxygen is 15 sccm, and the substrate temperature is room temperature.

The gate insulating film 102 and the oxide semiconductor film may be formed successively without exposure to air. Successive film formation without exposure to air makes it possible to obtain each interface of stacked layers, which is not contaminated by atmospheric components or impurity elements floating in air, such as water, hydrocarbon, or the like. Therefore, variation in characteristics of the thin film transistor can be reduced.

Next, as illustrated in FIG. 1A, the oxide semiconductor film is processed (patterned) into a desired shape by etching or the like, so that an island-shaped oxide semiconductor film 103 is formed over the gate insulating film 102 so as to overlap with the gate electrode 101 with the gate insulating film 102 provided therebetween.

Figure 1B:
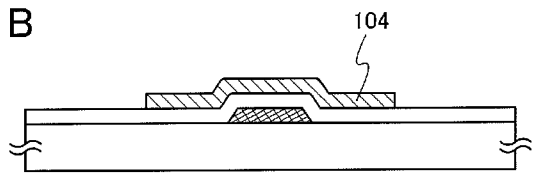

Next, the island-shaped oxide semiconductor film 103 is subjected to heat treatment at higher than or equal to 400° C. and lower than or equal to 700° C., preferably higher than or equal to 450° C. and lower than or equal to 650° C. under a reduced-pressure atmosphere, an inert gas atmosphere such as a nitrogen atmosphere or a rare gas atmosphere, an oxygen atmosphere, or an ultra-dry air (i.e., air having a moisture content of 20 ppm (—55° C. by dew-point conversion) or less, preferably 1 ppm or less, more preferably 10 ppb or less in the case where the measurement is performed with use of a CRDS (cavity-ring-down spectroscopy) type dew-point meter) atmosphere. Then, the island-shaped oxide semiconductor film 103 is slowly cooled to a temperature which is higher than or equal to room temperature and lower than 100° C. under an inert atmosphere. By heat treatment performed on the oxide semiconductor film 103 under the above-described atmosphere, moisture, hydrogen, and a hydroxy group included in the oxide semiconductor film 103 are eliminated; in such a manner, an island-shaped oxide semiconductor film 104 is formed as illustrated in FIG. 1B. Therefore, deterioration in characteristics of a thin film transistor in which the oxide semiconductor film 104 serves as a channel formation region due to the above impurities can be prevented.

In this embodiment, heat treatment is performed for 60 minutes under a nitrogen atmosphere in the state where the substrate temperature reaches 450° C. For the heat treatment, a heating method using an electric furnace or an instantaneous heating method such as a gas rapid thermal anneal (GRTA) method using a heated gas or a lamp rapid thermal anneal (LRTA) method using lamp light can be used. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

Note that in the heat treatment, it is preferable that moisture, hydrogen, and the like be not contained in nitrogen or a rare gas such as helium, neon, or argon. Alternatively, it is preferable that nitrogen or a rare gas such as helium, neon, or argon introduced into an apparatus for heat treatment have a purity of 6N (99.9999%) or more, preferably, 7N (99.99999%) or more (that is, the impurity concentration is 1 ppm or lower, preferably, 0.1 ppm or lower).

Alternatively, the heat treatment may be performed under air where the dew point under an atmospheric pressure is −60° C. or lower and the moisture content is small, instead of an inert gas atmosphere such as a nitrogen atmosphere or a rare gas atmosphere.

The island-shaped oxide semiconductor film 104 which is formed through the heat treatment under an inert gas atmosphere or a reduced-pressure atmosphere may be partially crystallized.

Note that after the heat treatment is performed on the oxide semiconductor film 104, heat treatment is performed on the oxide semiconductor film 104 under an oxygen atmosphere, whereby impurities such as moisture included in the oxide semiconductor film 104 can be removed. In addition, the heat treatment is performed under an oxygen atmosphere in order that the oxide semiconductor film 104 may include excessive oxygen, whereby resistance thereof can be increased. The heat treatment is performed at a temperature where a metal having a low melting point such as Zn included in the oxide semiconductor is less likely to be evaporated, for example, higher than or equal to 100° C. and lower than 350° C., preferably higher than or equal to 150° C. and lower than 250° C. It is preferable that an oxygen gas used for the heat treatment under an oxygen atmosphere do not include moisture, hydrogen, or the like. Alternatively, an oxygen gas which is introduced into the heat treatment apparatus preferably has a purity of 6N (99.9999%) or more, more preferably 7N (99.99999%) or more (that is, the impurity concentration in oxygen is 1 ppm or lower, preferably 0.1 ppm or lower).

Figure 1C:
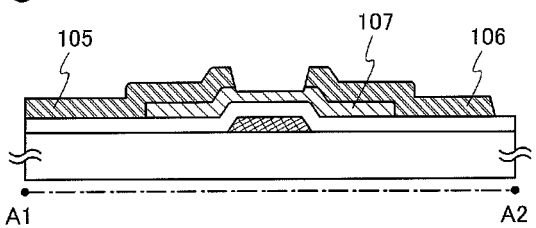

Next, as illustrated in FIG. 1C, a conductive film for a source electrode and a drain electrode is formed over the island-shaped oxide semiconductor film 104, and then, the conductive film is patterned by etching or the like to form a source electrode 105 and a drain electrode 106. In the patterning for forming the source electrode 105 and the drain electrode 106, an exposed portion of the island-shaped oxide semiconductor film 104 is partly etched, whereby an island-shaped oxide semiconductor film 107 having a groove (a recessed portion) is formed.

The conductive film is preferably formed using a material that can withstand heat treatment in a later step. For example, as a material of the conductive film for the source electrode and the drain electrode, an element selected from chromium, tantalum, titanium, molybdenum, tungsten, zirconium, beryllium, thorium, manganese, or magnesium, an alloy containing one or more of these elements as its component, or the like can be given. In order to further improve heat resistance to heat treatment which is to be performed after the source electrode 105 and the drain electrode 106 are formed, the conductive film for the source electrode and the drain electrode may be formed in combination of the above material with a heat resistant conductive material such as neodymium, scandium, or a nitride of these elements.

The source electrode 105 and the drain electrode 106 are formed to a thickness of 10 nm to 400 nm, preferably 100 nm to 300 nm. In this embodiment, a conductive film for the source electrode and the drain electrode is formed to a thickness of 200 nm by a sputtering method using a molybdenum target, and then, the conductive film is processed (patterned) into a desired shape by etching, whereby the source electrode 105 and the drain electrode 106 are formed.

Figure 2A:
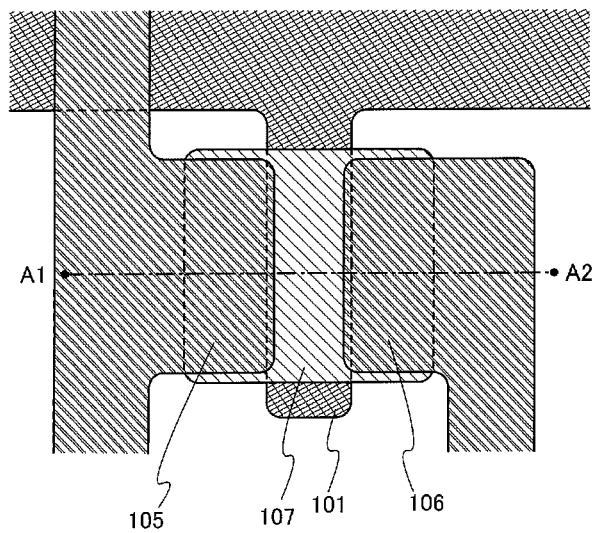
FIGS. 2A and 2B are top views of a manufactured thin film transistor.

FIG. 2A is a top view of a semiconductor device illustrated in FIG. 1C. FIG. 1C corresponds to a cross-sectional view taken along dashed line A1-A2 in FIG. 2A.

Figure 1D:
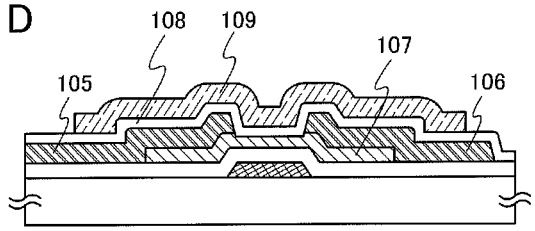

Next, as illustrated in FIG. 1D, an oxide insulating film 108 is formed in contact with the island-shaped oxide semiconductor film 107, the source electrode 105, and the drain electrode 106 by a sputtering method. The oxide insulating film 108 is formed in contact with the low-resistance island-shaped oxide semiconductor film 107 and formed using an inorganic insulating film which includes impurities such as moisture, hydrogen, oxygen, and a hydroxy group as little as possible and blocks entry of these impurities from the outside, specifically, a silicon oxide film, a silicon nitride oxide film, or the like.

In this embodiment, a silicon oxide film with a thickness of 300 nm is formed as the oxide insulating film 108. The substrate temperature at the time of the film formation may be higher than or equal to room temperature and lower than or equal to 300° C., and is set at 100° C. in this embodiment. Formation of the silicon oxide film by a sputtering method can be performed under a rare gas (for example, argon) atmosphere, an oxygen atmosphere, or an atmosphere including a rare gas (for example, argon) and oxygen. Further, a silicon oxide target or a silicon target may be used as a target. For example, with use of a silicon target, a silicon oxide film can be formed by a sputtering method under an atmosphere including oxygen and nitrogen.

When the oxide insulating film 108 is formed in contact with the low-resistance oxide semiconductor film 107 by a sputtering method, a PCVD method, or the like, the carrier concentration of at least a region in the low-resistance oxide semiconductor film 107 in contact with the oxide insulating film 108 is reduced, preferably to lower than $1 \times 10^{18}/cm^3$, so that the resistance of at least the region is increased. Thus, a high-resistance oxide semiconductor region can be formed. By the formation of the oxide insulating film 108, the oxide semiconductor film 107 has a high-resistance oxide semiconductor region in the vicinity of the interface between the oxide insulating film 108 and the oxide semiconductor film 107.

Note that after the source electrode 105 and the drain electrode 106 are formed and before the oxide insulating film 108 is formed, the oxide semiconductor film 107 may be again subjected to heat treatment under a reduced-pressure atmosphere, an inert gas atmosphere such as a nitrogen atmosphere or a rare gas atmosphere, an oxygen atmosphere, or an ultra-dry air (i.e., air having a moisture content of 20 ppm (−55° C. by dew-point conversion) or less, preferably 1 ppm or less, more preferably 10 ppb or less in the case where the measurement is performed with use of a CRDS (cavity-ring-down spectroscopy) type dew-point meter) atmosphere in order to eliminate moisture, hydrogen, and a hydroxy group included in the oxide semiconductor film 107. In consideration of heat resistance of the source electrode 105 and the drain electrode 106, the heat treatment after the source electrode 105 and the drain electrode 106 are formed is preferably performed at a temperature lower than the temperature of the heat treatment before the source electrode 105 and the drain electrode 106 are formed. Specifically, the heat treatment after the source electrode 105 and the drain electrode 106 are formed may be performed at higher than or equal to 350° C. and lower than or equal to 650° C., preferably higher than or equal to 400° C. and lower than or equal to 600° C.

Next, as illustrated in FIG. 1D, a conductive film is formed over the oxide insulating film 108 with use of one or more metals that easily absorb or adsorb moisture, a hydroxy group, or hydrogen, and then, the conductive film is patterned, whereby a back gate electrode 109 is formed to overlap with the oxide semiconductor film 107. Specifically, as the metal having such characteristics, titanium, platinum, vanadium, zirconium, hafnium, palladium, magnesium, niobium, a rare earth metal, or the like can be given. As the rare earth metal, an alloy including cerium (40% to 50%), lanthanum (20% to 40%), and a rare earth metal such as praseodymium, neodymium, or yttrium, which is called a misch metal (Mm), can also be used. The back gate electrode 109 may be a mixture, a metal compound, or an alloy which includes one or more of the above metals.

As the alloy used for the back gate electrode 109, an alloy called a hydrogen absorbing alloy can also be given. As the hydrogen absorbing alloy, for example, an $AB_5$ alloy, an $AB_2$ (Laves phase) alloy, an $A_2B$ alloy, or the like can be given. In the $AB_5$ alloy, one or more of a rare earth metal, niobium, and zirconium are included in A site, and one or more transition metals having a catalytic effect such as nickel, cobalt, aluminum, and tin are included in B site. As the rare earth metal, a misch metal can also be used. As the $AB_5$ alloy, for example, $LaNi_5$ or the like can be used for the back gate electrode 109. In the $AB_2$ (Laws phase) alloy, one or more of titanium, zirconium, and hafnium are included in A site, and one or more transition metals such as manganese, nickel, chromium, and vanadium are included in B site; for example, a Ti—Mn-based alloy, a Ti—Cr-based alloy, a Zr—Mn-based alloy, a Ti—V—Mn-based alloy, or the like can be given. As the $AB_2$ alloy, for example, $TiCr_2$, $TiMn_2$, or the like can be used for the back gate electrode 109. In the $A_2B$ alloy, one or more of magnesium and titanium are included in A site, and one or more of nickel and copper are included in B site. As the $A_2B$ alloy, for example, $Mg_2Ni$, $Mg_2Cu$, $Ti_2Ni$, or the like can be used for the back gate electrode 109. Note that in these hydrogen absorbing alloys, at least part of an element in A site or B site can be replaced with another element, and the actual composition is not necessarily in due form. As the hydrogen absorbing alloy, in addition to the above type alloys, a Ti—Fe alloy, a V-type alloy, a Pd-type alloy, a Ca-type alloy, a BCC alloy, or the like can be used for the back gate electrode 109.

The thickness of the back gate electrode 109 is set to 10 nm to 400 nm, preferably 100 nm to 200 nm. In this embodiment, a conductive film of 200 nm thick is formed using $TiCr_2$ by a sputtering method under the following conditions: an alloy that is a target (φ:6 inches) whose composition ratio of titanium to chromium is 1:2 is used; an argon gas is introduced into a chamber with a flow rate of 50 sccm; the pressure is 0.4 Pa; the electric power is 2 kW; and the film formation temperature is room temperature. Then, a photolithography step is performed. A resist mask is formed, and an unnecessary portion is removed by plasma etching with use of chlorine and oxygen as an etching gas so that the conductive film is processed (patterned) into a desired shape; in such a manner, the back gate electrode 109 is formed.

Next, after the back gate electrode 109 is formed, heat treatment is performed under a reduced-pressure atmosphere or an inert gas (such as nitrogen, helium, neon, or argon) atmosphere in the state where the back gate electrode 109 is exposed, whereby activation treatment for removing moisture, oxygen, hydrogen, or the like adsorbed onto a surface of or in the back gate electrode 109 is performed. In consideration of the heat resistance of the source electrode 105 and the drain electrode 106, the heat treatment is preferably performed at a temperature lower than the temperature of the heat treatment before the source electrode 105 and the drain electrode 106 are formed. Specifically, the heat treatment is performed at higher than or equal to 300° C. and lower than or equal to 650° C., preferably higher than or equal to 350° C. and lower than or equal to 600° C.

By the activation treatment, impurities such as moisture, a hydroxy group, or hydrogen which are present, for example, in the oxide semiconductor film 107, in the gate insulating film 102, at the interface between the oxide semiconductor film 107 and the gate insulating film 102 and its vicinity, or at the interface between the oxide semiconductor film 107 and the oxide insulating film 108 and its vicinity are absorbed or adsorbed by the back gate electrode 109 which has been activated; therefore, deterioration in the characteristics of the transistor due to the impurities can be prevented.

In addition, impurities such as moisture or hydrogen included in an atmosphere in which the semiconductor device is placed can be prevented from being taken into the oxide semiconductor film 107.

In this embodiment, heat treatment is performed for 10 minutes in the state where the substrate temperature reaches 400° C. and a treatment chamber is kept to a reduced-pressure atmosphere having a degree of vacuum of $5\times10^{-3}$ Pa or less, preferably $10^{-5}$ Pa or less by an evacuation unit such as a turbo molecular pump. For the heat treatment, a heating method using an electric furnace or an instantaneous heating method such as a gas rapid thermal anneal (GRTA) method using a heated gas or a lamp rapid thermal anneal (LRTA) method using lamp light can be used. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

Note that heat treatment for activation is performed in the state where the oxide semiconductor film 107 is in contact with the oxide insulating film 108. Therefore, a region of the oxide semiconductor film 107 in contact with the oxide insulating film 108 uniformly has higher resistance; thus, variation in electric characteristics of a thin film transistor 111 can be reduced.

Figure 1E:
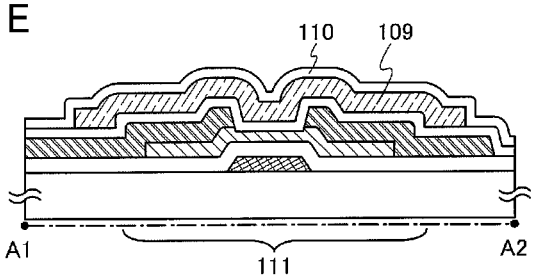

Next, after the activation treatment is performed, an insulating film 110 is formed so as to cover the back gate electrode 109 as illustrated in FIG. 1E. The insulating film 110 is preferably formed using a material having a high barrier property so that moisture and oxygen in the atmosphere are prevented from being adsorbed onto the surface of or in the back gate electrode 109. For example, the insulating film 110 can be formed to have a single-layer structure or a stacked-layer structure of a silicon nitride film, a silicon nitride oxide film, an aluminum nitride film, an aluminum nitride oxide film, or the like, as an insulating film having a high barrier property, by a plasma CVD method, a sputtering method, or the like. In order to obtain an effect of a barrier property, the insulating film 110 is preferably formed to a thickness of 15 nm to 400 nm, for example.

In this embodiment, an insulating film is formed to a thickness of 300 nm by a plasma CVD method. The insulating film is formed under the following conditions: the flow rate of a silane gas is 4 sccm; the flow rate of dinitrogen monoxide ($N_2O$) is 800 sccm; and the substrate temperature is 400° C.

By the formation of the insulating film 110, moisture and oxygen in the atmosphere can be prevented from being adsorbed onto the surface of or in the back gate electrode 109; therefore, the back gate electrode 109 can be kept to be activated, and reliability of the transistor can be increased.

Figure 2B:
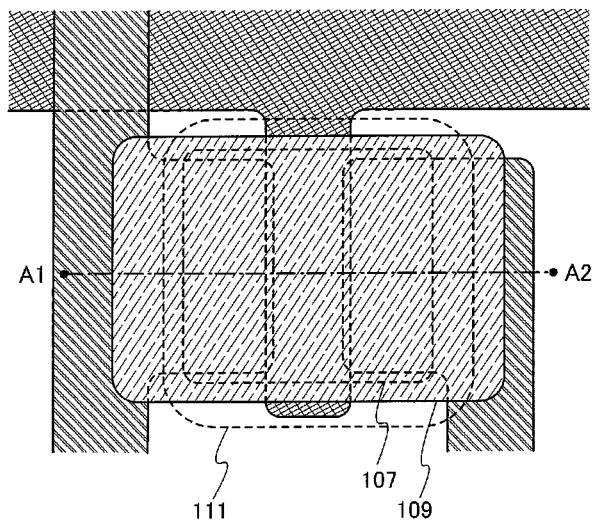

FIG. 2B is a top view of the semiconductor device in FIG. 1E. FIG. 1E corresponds to a cross-sectional view taken along dashed line A1-A2 in FIG. 2B.

The thin film transistor 111 includes the gate electrode 101; the gate insulating film 102 over the gate electrode 101; the oxide semiconductor film 107 over the gate insulating film 102; the source electrode 105 and the drain electrode 106 over the oxide semiconductor film 107; the oxide insulating film 108 over the source electrode 105 and the drain electrode 106; and the back gate electrode 109 over the oxide insulating film 108. The back gate electrode 109 is formed to overlap with the oxide semiconductor film 107, whereby impurities such as moisture, a hydroxy group, or hydrogen which are present, for example, in the oxide semiconductor film 107, in the gate insulating film 102, at the interface between the oxide semiconductor film 107 and the gate insulating film 102 and its vicinity, or at the interface between the oxide semiconductor film 107 and the oxide insulating film 108 and its vicinity are absorbed or adsorbed by the back gate electrode 109 which has been activated; therefore, deterioration in the characteristics of the transistor due to the impurities can be prevented. In addition, impurities such as moisture or hydrogen included in the atmosphere in which the semiconductor device is placed can be prevented from being taken into the oxide semiconductor film 107.

Note that in FIG. 2B, an example in which the back gate electrode 109 covers the whole oxide semiconductor film 107 is shown; however, the present invention is not limited to this structure. Since the back gate electrode 109 covers the whole oxide semiconductor film 107, an effect of reducing the impurities in the oxide semiconductor film 107 can be enhanced. However, the above effect can be obtained also in the case where at least the entire portion serving as a channel formation region in the oxide semiconductor film 107 or part of the portion overlaps with the back gate electrode 109.

Further, the back gate electrode 109 may be electrically insulated and in a floating state, or may be in a state where the back gate electrode 109 is supplied with a potential. In the case of the latter, the back gate electrode 109 may be supplied with the same potential as the gate electrode 101, or may be supplied with a fixed potential such as a ground potential. The level of the potential supplied to the back gate electrode 109 is controlled, whereby the threshold voltage of the thin film transistor 111 can be controlled. Note that in the case where the back gate electrode 109 is formed using a metal material having low electrical conductivity such as $TiCr_2$, a conductive film having low resistance is formed in contact with the back gate electrode 109 and the combined resistance of these conductive films is low; in such a manner, increase in power consumption due to the parasitic resistance may be prevented.

The step of performing heat treatment for activating the back gate electrode 109 and the step of forming the insulating film 110 in contact with the back gate electrode 109 are successively performed without exposure to air (such a process is also referred to as successive treatment or an insitu process), whereby moisture and oxygen in an atmosphere can be prevented from being adsorbed onto the surface of or in the back gate electrode 109. As a result, the back gate electrode 109 can be kept to be activated, and the reliability of the thin film transistor 111 can be more increased.

Note that a substrate transfer step, an alignment step, a heating or cooling step, or the like may be provided between the step of performing heat treatment for activating the back gate electrode 109 and the step of forming the insulating film 110 in contact with the back gate electrode 109. Such a process is also within the scope of the successive treatment in this specification. However, the following case is not within the scope of the successive treatment in this specification: there is a step in which liquid is used, such as a cleaning step, a wet etching step, or a resist formation step between the above two steps.

Note that in this embodiment, although an example in which the back gate electrode 109 is formed using one or more metals that easily absorb or adsorb moisture, a hydroxy group, or hydrogen is described, the gate electrode 101 may be formed using one or more metals that easily absorb or adsorb moisture, a hydroxy group, or hydrogen. In this case, after the gate electrode 101 is formed, the gate electrode 101 may be subjected to heat treatment for activation under the same condition as the back gate electrode 109. The gate electrode 101 is formed using a metal having the above characteristics, whereby impurities such as moisture, a hydroxy group, and hydrogen which are present, for example, in the oxide semiconductor film 107, in the gate insulating film 102, at the interface between the oxide semiconductor film 107 and the gate insulating film 102 and its vicinity, or at the interface between the oxide semiconductor film 107 and the oxide insulating film 108 and its vicinity are absorbed or adsorbed by the gate electrode 101 which has been activated; therefore, deterioration in the characteristics of the transistor due to the impurities can be prevented.

Embodiment 2

In this embodiment, a method for manufacturing a semiconductor device including a bottom-contact thin film transistor having a structure which is different from the structure of the thin film transistor 111 described in Embodiment 1 will be described. The same portion as or a portion having a function similar to those described in Embodiment 1 can be formed in a manner similar to that described in Embodiment 1, and also the steps similar to those of Embodiment 1 can be performed in a manner similar to those described in Embodiment 1; therefore, repetitive description is omitted.

A method for manufacturing a semiconductor device will be described with reference to FIGS. 3A to 3D and FIGS. 4A and 4B.

Figure 3A:
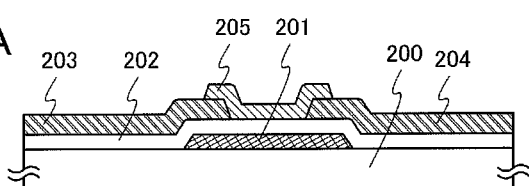
FIGS. 3A to 3D illustrate a method for manufacturing a semiconductor device.

As illustrated in FIG. 3A, a gate electrode 201 is formed over a substrate 200 having an insulating surface. An insulating film serving as a base film may be provided between the substrate 200 and the gate electrode 201. The material and the structure of the gate electrode 101 described in Embodiment 1 may be referred to for the material and the structure of the gate electrode 201. The material and the structure of the base film described in Embodiment 1 may be referred to for the material and the structure of the base film.

Next, a gate insulating film 202 is formed over the gate electrode 201. The material, the structure, and the formation method of the gate insulating film 102 described in Embodiment 1 may be referred to for the material, the structure, and the formation method of the gate insulating film 202.

In this embodiment, the gate insulating film 202 is formed to a thickness of 200 nm by a plasma CVD method. The gate insulating film 202 is formed under the following conditions: the flow rate of a silane gas is 4 sccm; the flow rate of dinitrogen monoxide ($N_2O$) is 800 sccm; and the substrate temperature is 400° C.

Next, a conductive film for a source electrode and a drain electrode is formed over the gate insulating film 202. Then, the conductive film is processed (patterned) into a desired shape by etching or the like, whereby a source electrode 203 and a drain electrode 204 are formed. The material and the structure of the conductive film which is patterned for forming the source electrode 105 and the drain electrode 106 in Embodiment 1 may be referred to for the material and the structure of the conductive film. In order to prevent defective coverage such as breakage of an oxide semiconductor film to be formed later, the source electrode 203 and the drain electrode 204 are formed to have a smaller thickness than the source electrode and the drain electrode in Embodiment 1, and are formed to a thickness of 10 nm to 300 nm, preferably 100 nm to 200 nm.

In this embodiment, a conductive film for the source electrode and the drain electrode is formed to a thickness of 150 nm by a sputtering method using a molybdenum target, and then, the conductive film is processed (patterned) into a desired shape by etching, whereby the source electrode 203 and the drain electrode 204 are formed.

Next, an oxide semiconductor film is formed over the source electrode 203, the drain electrode 204, and the gate insulating film 202. An oxide semiconductor film for forming a channel formation region may be formed using an oxide material having semiconductor characteristics described in Embodiment 1. The oxide semiconductor film is formed by a sputtering method using an oxide semiconductor target. Moreover, the oxide semiconductor film can be formed by a sputtering method under a rare gas (for example, argon) atmosphere, an oxygen atmosphere, or an atmosphere including a rare gas (for example, argon) and oxygen.

Note that before the oxide semiconductor film is formed by a sputtering method, dust attached to a surface of the gate insulating film 202 is preferably removed by reverse sputtering in which an argon gas is introduced and plasma is generated.

The thickness of the oxide semiconductor film is set to 5 nm to 300 nm, preferably 10 nm to 100 nm. In this embodiment, as the oxide semiconductor film, an In—Ga—Zn—O-based non-single-crystal film with a thickness of 50 nm, which is obtained by a sputtering method using an oxide semiconductor target including indium (In), gallium (Ga), and zinc (Zn) ($In_2O_3$:$Ga_2O_3$:ZnO=1:1:1), is used. In this embodiment, a DC sputtering method is employed, the flow rate of argon is 30 sccm, the flow rate of oxygen is 15 sccm, and the substrate temperature is room temperature.

Next, as illustrated in FIG. 3A, the oxide semiconductor film is processed (patterned) into a desired shape by etching or the like, so that an island-shaped oxide semiconductor film 205 is formed over the gate insulating film 202 so as to overlap with the gate electrode 201 with the gate insulating film 202 provided therebetween.

Figure 3B:
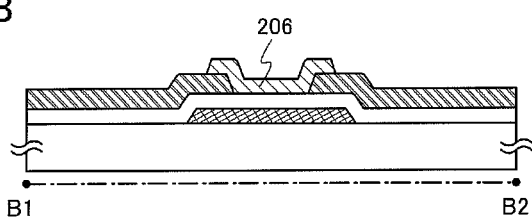

Next, the island-shaped oxide semiconductor film 205 is subjected to heat treatment under a reduced-pressure atmosphere, an inert gas atmosphere such as a nitrogen atmosphere or a rare gas atmosphere, an oxygen atmosphere, or an ultra-dry air (i.e., air having a moisture content of 20 ppm (−55° C. by dew-point conversion) or less, preferably 1 ppm or less, more preferably 10 ppb or less in the case where the measurement is performed with use of a CRDS (cavity-ring-down spectroscopy) type dew-point meter) atmosphere. The heat treatment for the oxide semiconductor film 103 described in Embodiment 1 may be referred to for the heat treatment for the oxide semiconductor film 205. Note that the heat treatment may be performed at higher than or equal to 350° C. and lower than or equal to 650° C., preferably higher than or equal to 400° C. and lower than or equal to 600° C. in consideration of the heat resistance of the source electrode 203 and the drain electrode 204. By heat treatment performed on the oxide semiconductor film 205 under the above-described atmosphere, moisture, hydrogen, and a hydroxy group included in the oxide semiconductor film 205 are eliminated; in such a manner, an island-shaped oxide semiconductor film 206 is formed as illustrated in FIG. 3B. Therefore, deterioration in characteristics of a thin film transistor in which the oxide semiconductor film 206 serves as a channel formation region due to the above impurities can be prevented.

In this embodiment, heat treatment is performed for 60 minutes under a nitrogen atmosphere in the state where the substrate temperature reaches 450° C.

Note that after the heat treatment is performed on the oxide semiconductor film 205 to form the oxide semiconductor film 206, heat treatment is performed on the oxide semiconductor film 206 under an oxygen atmosphere, whereby impurities such as moisture included in the oxide semiconductor film 206 can be removed. In addition, the heat treatment is performed under an oxygen atmosphere in order that the oxide semiconductor film 206 may include excessive oxygen, whereby resistance thereof can be increased. The heat treatment under an oxygen atmosphere for the oxide semiconductor film 104 described in Embodiment 1 may be referred to for the heat treatment under an oxygen atmosphere for the oxide semiconductor film 206.

Figure 4A:
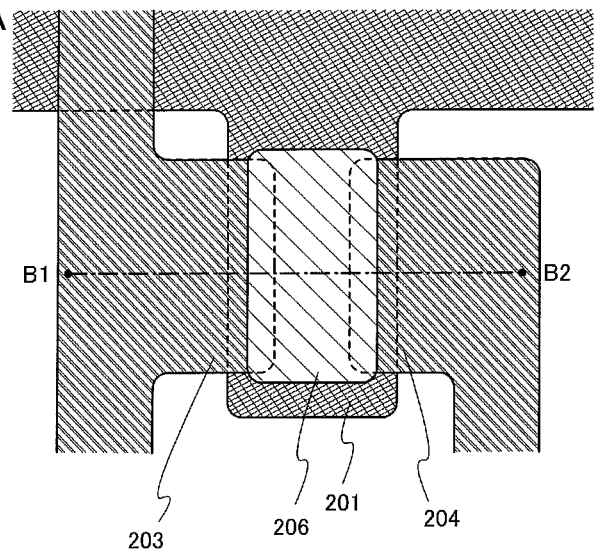
FIGS. 4A and 4B are top views of a manufactured thin film transistor.

FIG. 4A is a top view of the semiconductor device in FIG. 3B. FIG. 3B corresponds to a cross-sectional view taken along dashed line B1-B2 in FIG. 4A.

Figure 3C:
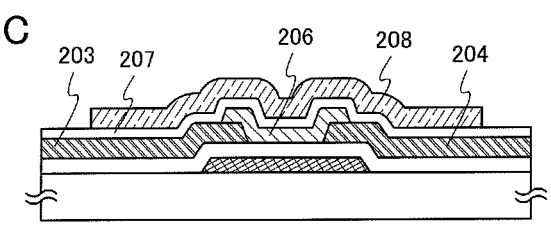

Next, as illustrated in FIG. 3C, an oxide insulating film 207 is formed in contact with the island-shaped oxide semiconductor film 206, the source electrode 203, and the drain electrode 204 by a sputtering method. The oxide insulating film 207 is formed in contact with the low-resistance island-shaped oxide semiconductor film 206 and formed using an inorganic insulating film which includes impurities such as moisture, hydrogen, oxygen, and a hydroxy group as little as possible and blocks entry of these impurities from the outside, specifically, a silicon oxide film, a silicon nitride oxide film, or the like.

In this embodiment, a silicon oxide film with a thickness of 300 nm is formed as the oxide insulating film 207. The substrate temperature at the time of the film formation may be higher than or equal to room temperature and lower than or equal to 300° C., and is set at 100° C. in this embodiment. Formation of the silicon oxide film by a sputtering method can be performed under a rare gas (for example, argon) atmosphere, an oxygen atmosphere, or an atmosphere including a rare gas (for example, argon) and oxygen. Further, a silicon oxide target or a silicon target may be used as a target. For example, with use of a silicon target, a silicon oxide film can be formed by a sputtering method under an atmosphere including oxygen and nitrogen.

When the oxide insulating film 207 is formed in contact with the low-resistance oxide semiconductor film 206 by a sputtering method, a PCVD method, or the like, the carrier concentration of at least a region in the low-resistance oxide semiconductor film 206 in contact with the oxide insulating film 207 is reduced, preferably to lower than $1 \times 10^{18}/cm^3$, so that the resistance of at least the region is increased. Thus, a high-resistance oxide semiconductor region can be formed. By the formation of the oxide insulating film 207, the oxide semiconductor film 206 has a high-resistance oxide semiconductor region in the vicinity of the interface between the oxide insulating film 207 and the oxide semiconductor film 206.

Next, as illustrated in FIG. 3C, a conductive film is formed over the oxide insulating film 207 with use of one or more metals that easily absorb or adsorb moisture, a hydroxy group, or hydrogen, and then, the conductive film is patterned, whereby a back gate electrode 208 is formed to overlap with the oxide semiconductor film 206. The material and the structure of the back gate electrode 109 described in Embodiment 1 may be referred to for the material and the structure of the back gate electrode 208.

In this embodiment, a conductive film of 200 nm thick is formed using $TiCr_2$ by a sputtering method under the following conditions: an alloy that is a target (φ:6 inches) whose composition ratio of titanium to chromium is 1:2 is used; an argon gas is introduced into a chamber with a flow rate of 50 sccm; the pressure is 0.4 Pa; the electric power is 2 kW; and the film formation temperature is room temperature. Then, a photolithography step is performed. A resist mask is formed, and an unnecessary portion is removed by plasma etching with use of chlorine and oxygen as an etching gas so that the conductive film is processed (patterned) into a desired shape; in such a manner, the back gate electrode 208 is formed.

Next, after the back gate electrode 208 is formed, heat treatment is performed under a reduced-pressure atmosphere or an inert gas atmosphere in the state where the back gate electrode 208 is exposed, whereby activation treatment for removing moisture, oxygen, hydrogen, or the like adsorbed onto a surface of or in the back gate electrode 208 is performed. The condition of the activation treatment for the back gate electrode 109 described in Embodiment 1 can be referred to for the condition of the activation treatment.

By the above activation treatment, impurities such as moisture, a hydroxy group, and hydrogen which are present, for example, in the oxide semiconductor film 206, in the gate insulating film 202, at the interface between the oxide semiconductor film 206 and the gate insulating film 202 and its vicinity, or at the interface between the oxide semiconductor film 206 and the oxide insulating film 207 and its vicinity are absorbed or adsorbed by the back gate electrode 208 which has been activated; therefore, deterioration in the characteristics of the transistor due to the impurities can be prevented.

In addition, impurities such as moisture and hydrogen included in an atmosphere in which the semiconductor device is placed can be prevented from being taken into the oxide semiconductor film 206.

In this embodiment, heat treatment is performed for 10 minutes in the state where the substrate temperature reaches 400° C. and a treatment chamber is kept to a reduced-pressure atmosphere having a degree of vacuum of $5 \times 10^{-3}$ Pa or less, preferably $10^{-5}$ Pa or less by an evacuation unit such as a turbo molecular pump.

Note that heat treatment for activation is performed in the state where the oxide semiconductor film 206 is in contact with the oxide insulating film 207. Therefore, a region of the oxide semiconductor film 206 in contact with the oxide insulating film 207 uniformly has higher resistance; thus, variation in electric characteristics of a thin film transistor 211 can be reduced.

Figure 3D:
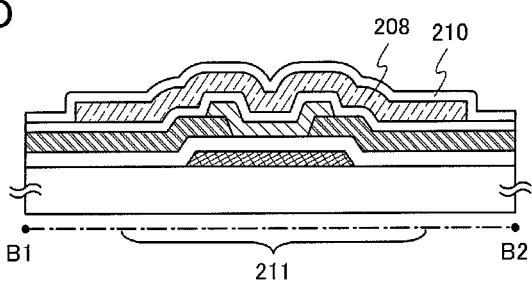

Next, after the activation treatment is performed, an insulating film 210 is formed so as to cover the back gate electrode 208 as illustrated in FIG. 3D. The insulating film 210 is preferably formed using a material having a high barrier property so that moisture and oxygen in the atmosphere are prevented from being adsorbed onto the surface of or in the back gate electrode 208. The material and the structure of the insulating film 110 described in Embodiment 1 may be referred to for the material and the structure of the insulating film 210.

In this embodiment, an insulating film is formed to a thickness of 300 nm by a plasma CVD method. The insulating film is formed under the following conditions: the flow rate of a silane gas is 4 sccm; the flow rate of dinitrogen monoxide ($N_2O$) is 800 sccm; and the substrate temperature is 400° C.

By the formation of the insulating film 210, moisture and oxygen in the atmosphere can be prevented from being adsorbed onto the surface of or in the back gate electrode 208; therefore, the back gate electrode 208 can be kept to be activated, and reliability of the transistor can be increased.

Figure 4B:
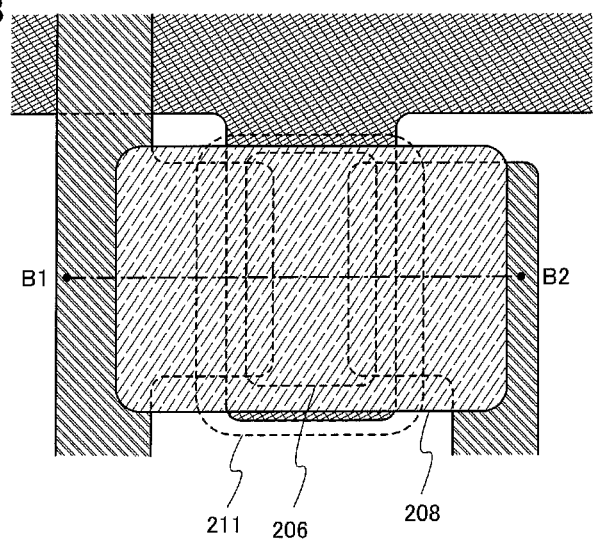

FIG. 4B is a top view of the semiconductor device in FIG. 3D. FIG. 3D corresponds to a cross-sectional view taken along dashed line B1-B2 in FIG. 4B.

The thin film transistor 211 includes the gate electrode 201; the gate insulating film 202 over the gate electrode 201; the source electrode 203 and the drain electrode 204 over the gate insulating film 202; the oxide semiconductor film 206 over the gate electrode 201, the source electrode 203, and the drain electrode 204; the oxide insulating film 207 over the oxide semiconductor film 206; and the back gate electrode 208 over the oxide insulating film 207. The back gate electrode 208 is formed to overlap with the oxide semiconductor film 206, whereby impurities such as moisture, a hydroxy group, and hydrogen which are present, for example, in the oxide semiconductor film 206, in the gate insulating film 202, at the interface between the oxide semiconductor film 206 and the gate insulating film 202 and its vicinity, or at the interface between the oxide semiconductor film 206 and the oxide insulating film 207 and its vicinity are absorbed or adsorbed by the back gate electrode 208 which has been activated; therefore, deterioration in the characteristics of the transistor due to the impurities can be prevented. In addition, impurities such as moisture and hydrogen included in the atmosphere in which the semiconductor device is placed can be prevented from being taken into the oxide semiconductor film 206.

Note that in FIG. 4B, an example in which the back gate electrode 208 covers the whole oxide semiconductor film 206 is shown; however, the present invention is not limited to this structure. Since the back gate electrode 208 covers the whole oxide semiconductor film 206, an effect of reducing the impurities in the oxide semiconductor film 206 can be enhanced. However, the above effect can be obtained also in the case where at least the entire portion serving as a channel formation region in the oxide semiconductor film 206 or part of the portion overlaps with the back gate electrode 208.

Further, the back gate electrode 208 may be electrically insulated and in a floating state, or may be in a state where the back gate electrode 208 is supplied with a potential. In the case of the latter, the back gate electrode 208 may be supplied with the same potential as the gate electrode 201, or may be supplied with a fixed potential such as a ground potential. The level of the potential supplied to the back gate electrode 208 is controlled, whereby the threshold voltage of the thin film transistor 211 can be controlled. Note that in the case where the back gate electrode 208 is formed using a metal material having low electrical conductivity such as $TiCr_2$, a conductive film having low resistance is formed in contact with the back gate electrode 208 and the combined resistance of these conductive films is low; in such a manner, increase in power consumption due to the parasitic resistance may be prevented.

The step of performing heat treatment for activating the back gate electrode 208 and the step of forming the insulating film 210 in contact with the back gate electrode 208 are successively performed without exposure to air (such a process is also referred to as successive treatment or an insitu process), whereby moisture and oxygen in an atmosphere can be prevented from being adsorbed onto the surface of or in the back gate electrode 208. As a result, the back gate electrode 208 can be kept to be activated, and the reliability of the thin film transistor 211 can be more increased.

Note that a substrate transfer step, an alignment step, a heating or cooling step, or the like may be provided between the step of performing heat treatment for activating the back gate electrode 208 and the step of forming the insulating film 210 in contact with the back gate electrode 208. Such a process is also within the scope of the successive treatment in this specification. However, the following case is not within the scope of the successive treatment in this specification: there is a step in which liquid is used, such as a cleaning step, a wet etching step, or a resist formation step between the above two steps.

Note that in this embodiment, although an example in which the back gate electrode 208 is formed using one or more metals that easily absorb or adsorb moisture, a hydroxy group, or hydrogen is described, the gate electrode 201 may be formed using one or more metals that easily absorb or adsorb moisture, a hydroxy group, or hydrogen. In this case, after the gate electrode 201 is formed, the gate electrode 201 may be subjected to heat treatment for activation under the same condition as the back gate electrode 208. The gate electrode 201 is formed using a metal having the above characteristics, whereby impurities such as moisture, a hydroxy group, and hydrogen which are present, for example, in the oxide semiconductor film 206, in the gate insulating film 202, at the interface between the oxide semiconductor film 206 and the gate insulating film 202 and its vicinity, or at the interface between the oxide semiconductor film 206 and the oxide insulating film 207 and its vicinity are absorbed or adsorbed by the gate electrode 201 which has been activated; therefore, deterioration in the characteristics of the transistor due to the impurities can be prevented.

This embodiment can be implemented in combination with another embodiment as appropriate.

Embodiment 3

In this embodiment, a method for manufacturing a semiconductor device including a bottom-gate thin film transistor having a structure which is different from the structure of the thin film transistor 111 described in Embodiment 1 and the structure of the thin film transistor 211 described in Embodiment 2 will be described. The same portion as or a portion having a function similar to those described in Embodiment 1 can be formed in a manner similar to that described in Embodiment 1, and also the steps similar to those of Embodiment 1 can be performed in a manner similar to those described in Embodiment 1; therefore, repetitive description is omitted.

A method for manufacturing a semiconductor device will be described with reference to FIGS. 5A to 5E and FIGS. 6A and 6B.

Figure 5A:
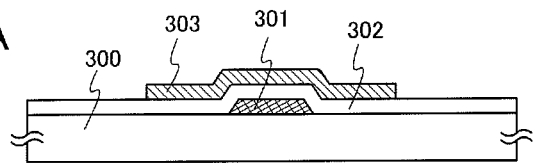
FIGS. 5A to 5E illustrate a method for manufacturing a semiconductor device.

As illustrated in FIG. 5A, a gate electrode 301 is formed over a substrate 300 having an insulating surface. An insulating film serving as a base film may be provided between the substrate 300 and the gate electrode 301. The material and the structure of the gate electrode 101 described in Embodiment 1 may be referred to for the material and the structure of the gate electrode 301. The material and the structure of the base film described in Embodiment 1 may be referred to for the material and the structure of the base film.

Next, a gate insulating film 302 is formed over the gate electrode 301. The material, the structure, and the formation method of the gate insulating film 102 described in Embodiment 1 may be referred to for the material, the structure, and the formation method of the gate insulating film 302.

In this embodiment, the gate insulating film 302 is formed to a thickness of 200 nm by a plasma CVD method. The gate insulating film 302 is formed under the following conditions: the flow rate of a silane gas is 4 sccm; the flow rate of dinitrogen monoxide ($N_2O$) is 800 sccm; and the substrate temperature is 400° C.

Next, an oxide semiconductor film is formed over the gate insulating film 302. An oxide semiconductor film for forming a channel formation region may be formed using an oxide material having semiconductor characteristics described in Embodiment 1. The oxide semiconductor film is formed by a sputtering method using an oxide semiconductor target. Moreover, the oxide semiconductor film can be formed by a sputtering method under a rare gas (for example, argon) atmosphere, an oxygen atmosphere, or an atmosphere including a rare gas (for example, argon) and oxygen.

Note that before the oxide semiconductor film is formed by a sputtering method, dust attached to a surface of the gate insulating film 302 is preferably removed by reverse sputtering in which an argon gas is introduced and plasma is generated.

The thickness of the oxide semiconductor film is set to 5 nm to 300 nm, preferably 10 nm to 100 nm. In this embodiment, as the oxide semiconductor film, an In—Ga—Zn—O-based non-single-crystal film with a thickness of 50 nm, which is obtained by a sputtering method using an oxide semiconductor target including indium (In), gallium (Ga), and zinc (Zn) ($In_2O_3$:$Ga_2O_3$:ZnO=1:1:1), is used. In this embodiment, a DC sputtering method is employed, the flow rate of argon is 30 sccm, the flow rate of oxygen is 15 sccm, and the substrate temperature is room temperature.

Next, as illustrated in FIG. 5A, the oxide semiconductor film is processed (patterned) into a desired shape by etching or the like, so that an island-shaped oxide semiconductor film 303 is formed over the gate insulating film 302 so as to overlap with the gate electrode 301 with the gate insulating film 302 provided therebetween.

Figure 5B:
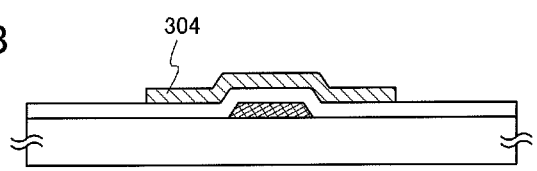

Next, the island-shaped oxide semiconductor film 303 is subjected to heat treatment under an inert gas (such as nitrogen, helium, neon, or argon) atmosphere. The heat treatment for the oxide semiconductor film 103 described in Embodiment 1 may be referred to for the heat treatment for the oxide semiconductor film 303. By heat treatment performed on the oxide semiconductor film 303 under the above-described atmosphere, moisture, hydrogen, and a hydroxy group included in the oxide semiconductor film 303 are eliminated; in such a manner, an island-shaped oxide semiconductor film 304 is formed as illustrated in FIG. 5B. Therefore, deterioration in characteristics of a thin film transistor in which the oxide semiconductor film 304 serves as a channel formation region due to the above impurities can be prevented.

In this embodiment, heat treatment is performed for 60 minutes under a nitrogen atmosphere in the state where the substrate temperature reaches 450° C.

Note that after the heat treatment is performed on the oxide semiconductor film 303 to form the oxide semiconductor film 304, heat treatment is performed on the oxide semiconductor film 304 under an oxygen atmosphere, whereby impurities such as moisture included in the oxide semiconductor film 304 can be removed. In addition, the heat treatment is performed under an oxygen atmosphere in order that the oxide semiconductor film 304 may include excessive oxygen, whereby resistance thereof can be increased. The heat treatment under an oxygen atmosphere for the oxide semiconductor film 104 described in Embodiment 1 may be referred to for the heat treatment under an oxygen atmosphere for the oxide semiconductor film 304.

Figure 5C:
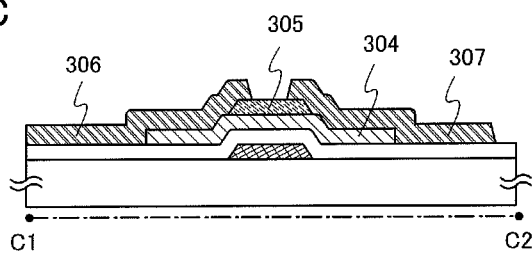

Next, as illustrated in FIG. 5C, a channel protective film 305 is formed over the oxide semiconductor film 304 so as to overlap with a portion of the oxide semiconductor film 304, which serves as a channel formation region later. The channel protective film 305 can prevent the portion of the oxide semiconductor film 304, which serves as a channel formation region later, from being damaged in a later step (for example, reduction in thickness due to plasma or an etchant in etching). Therefore, reliability of the thin film transistor can be improved.

The channel protective film 305 can be formed using an inorganic material including oxygen (such as silicon oxide, silicon oxynitride, or silicon nitride oxide). The channel protective film 305 can be formed by a vapor deposition method such as a plasma CVD method or a thermal CVD method, or a sputtering method. After the formation of the channel protective film 305, the shape thereof is processed by etching. Here, the channel protective film 305 is formed in such a manner that a silicon oxide film is formed by a sputtering method and processed by etching using a mask formed by photolithography.

When the channel protective film 305 which is an oxide insulating film is formed in contact with the island-shaped oxide semiconductor film 304 by a sputtering method, a PCVD method, or the like, the carrier concentration of at least a region in the island-shaped oxide semiconductor film 304 in contact with the channel protective film 305 is reduced, preferably to lower than $1\times10^{18}/cm^3$, more preferably to $1\times10^{14}/cm^3$ or lower, so that the resistance of at least the region is increased. Thus, a high-resistance oxide semiconductor region can be formed. By the formation of the channel protective film 305, the oxide semiconductor film 304 has a high-resistance oxide semiconductor region in the vicinity of the interface between the oxide semiconductor film 304 and the channel protective film 305.

Next, a conductive film for a source electrode and a drain electrode is formed over the island-shaped oxide semiconductor film 304. Then, the conductive film is processed (patterned) into a desired shape by etching or the like, whereby a source electrode 306 and a drain electrode 307 are formed in contact with the island-shaped oxide semiconductor film 304 as illustrated in FIG. 5C. The material and the structure of the conductive film which is patterned for forming the source electrode 105 and the drain electrode 106 described in Embodiment 1 may be referred to for the material and the structure of the conductive film.

In this embodiment, a conductive film for the source electrode and the drain electrode is formed to a thickness of 200 nm by a sputtering method using a molybdenum target, and then, the conductive film is processed (patterned) into a desired shape by etching; in such a manner, the source electrode 306 and the drain electrode 307 are formed.

Figure 6A:
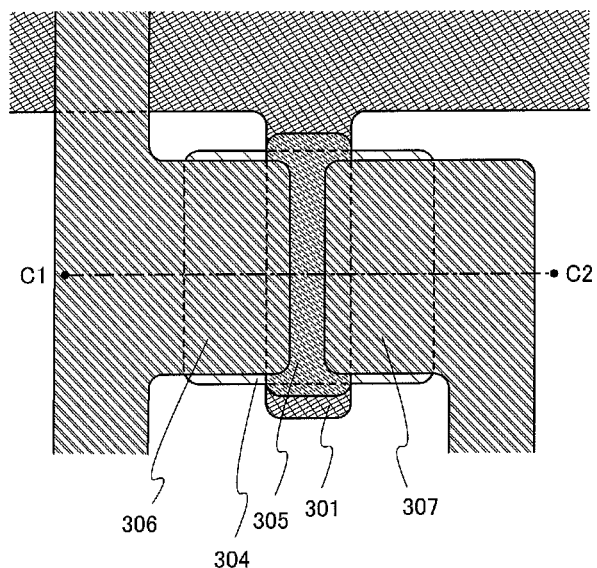
FIGS. 6A and 6B are top views of a manufactured thin film transistor.

FIG. 6A is a top view of the semiconductor device in FIG. 5C. FIG. 5C corresponds to a cross-sectional view taken along dashed line C1-C2 in FIG. 6A.

Figure 5D:
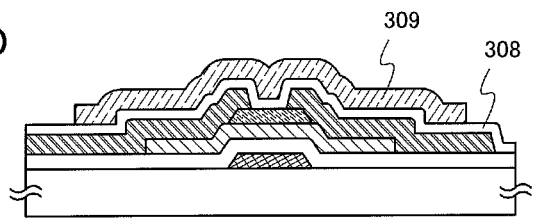

Next, as illustrated in FIG. 5D, an oxide insulating film 308 is formed over the island-shaped oxide semiconductor film 304, the source electrode 306, and the drain electrode 307 by a sputtering method. The oxide insulating film 308 is formed over the low-resistance island-shaped oxide semiconductor film 304 and formed using an inorganic insulating film which includes impurities such as moisture, hydrogen, oxygen, and a hydroxy group as little as possible and blocks entry of these impurities from the outside, specifically, a silicon oxide film, a silicon nitride oxide film, or the like.

In this embodiment, a silicon oxide film with a thickness of 300 nm is formed as the oxide insulating film 308. The substrate temperature at the time of the film formation may be higher than or equal to room temperature and lower than or equal to 300° C., and is set at 100° C. in this embodiment. Formation of the silicon oxide film by a sputtering method can be performed under a rare gas (for example, argon) atmosphere, an oxygen atmosphere, or an atmosphere including a rare gas (for example, argon) and oxygen. Further, a silicon oxide target or a silicon target may be used as a target. For example, with use of a silicon target, a silicon oxide film can be formed by a sputtering method under an atmosphere including oxygen and nitrogen.

Next, as illustrated in FIG. 5D, a conductive film is formed over the oxide insulating film 308 with use of one or more metals that easily absorb or adsorb moisture, a hydroxy group, or hydrogen, and then, the conductive film is patterned, whereby a back gate electrode 309 is formed to overlap with the oxide semiconductor film 304. The material and the structure of the back gate electrode 109 described in Embodiment 1 may be referred to for the material and the structure of the back gate electrode 309.

In this embodiment, a conductive film of 200 nm thick is formed using $TiCr_2$ by a sputtering method under the following conditions: an alloy that is a target (φ:6 inches) whose composition ratio of titanium to chromium is 1:2 is used; an argon gas is introduced into a chamber with a flow rate of 50 sccm; the pressure is 0.4 Pa; the electric power is 2 kW; and the film formation temperature is room temperature. Then, a photolithography step is performed. A resist mask is formed, and an unnecessary portion is removed by plasma etching with use of chlorine and oxygen as an etching gas so that the conductive film is processed (patterned) into a desired shape; in such a manner, the back gate electrode 309 is formed.

Next, after the back gate electrode 309 is formed, heat treatment is performed under a reduced-pressure atmosphere or an inert gas atmosphere in the state where the back gate electrode 309 is exposed, whereby activation treatment for removing moisture, oxygen, hydrogen, or the like adsorbed onto a surface of or in the back gate electrode 309 is performed. The condition of the activation treatment for the back gate electrode 109 described in Embodiment 1 can be referred to for the condition of the activation treatment.

By the above activation treatment, impurities such as moisture, a hydroxy group, and hydrogen which are present, for example, in the oxide semiconductor film 304, in the gate insulating film 302, at the interface between the oxide semiconductor film 304 and the gate insulating film 302 and its vicinity, or at the interface between the oxide semiconductor film 304 and the oxide insulating film 308 and its vicinity are absorbed or adsorbed by the back gate electrode 309 which has been activated; therefore, deterioration in the characteristics of the transistor due to the impurities can be prevented.

In addition, impurities such as moisture and hydrogen included in an atmosphere in which the semiconductor device is placed can be prevented from being taken into the oxide semiconductor film 304.

In this embodiment, heat treatment is performed for 10 minutes in the state where the substrate temperature reaches 400° C. and a treatment chamber is kept to a reduced-pressure atmosphere having a degree of vacuum of $5 \times 10^{-3}$ Pa or less, preferably $10^{-5}$ Pa or less by an evacuation unit such as a turbo molecular pump.

Note that heat treatment for activation is performed in the state where the oxide semiconductor film 304 is in contact with the channel protective film 305. Therefore, a region of the oxide semiconductor film 304 in contact with the channel protective film 305 uniformly has higher resistance; thus, variation in electric characteristics of a thin film transistor 311 can be reduced.

Figure 5E:
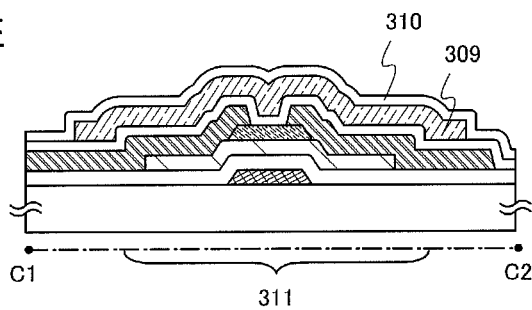

Next, after the activation treatment is performed, an insulating film 310 is formed so as to cover the back gate electrode 309 as illustrated in FIG. 5E. The insulating film 310 is preferably formed using a material having a high barrier property so that moisture and oxygen in the atmosphere are prevented from being adsorbed onto the surface of or in the back gate electrode 309. The material and the structure of the insulating film 110 described in Embodiment 1 may be referred to for the material and the structure of the insulating film 310.

In this embodiment, an insulating film is formed to a thickness of 300 nm by a plasma CVD method. The insulating film is formed under the following conditions: the flow rate of a silane gas is 4 sccm; the flow rate of dinitrogen monoxide ($N_2O$) is 800 sccm; and the substrate temperature is 400° C.

By the formation of the insulating film 310, moisture and oxygen in the atmosphere can be prevented from being adsorbed onto the surface of or in the back gate electrode 309; therefore, the back gate electrode 309 can be kept to be activated, and reliability of the transistor can be increased.

Figure 6B:
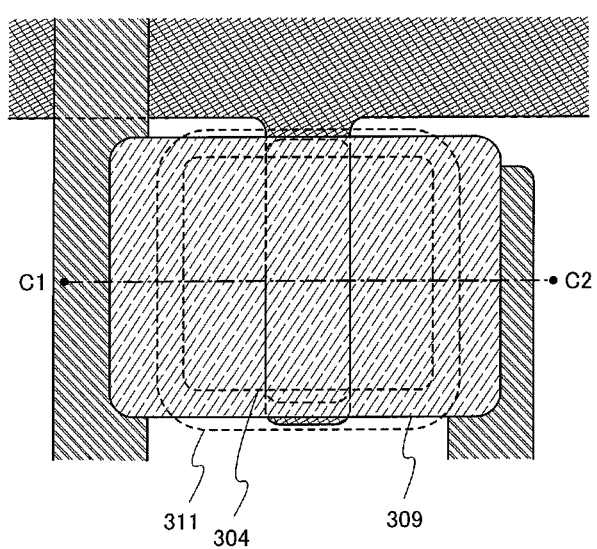

FIG. 6B is a top view of the semiconductor device in FIG. 5E. FIG. 5E corresponds to a cross-sectional view taken along dashed line C1-C2 in FIG. 6B.

The thin film transistor 311 includes the gate electrode 301; the gate insulating film 302 over the gate electrode 301; the oxide semiconductor film 304 over the gate insulating film 302; the channel protective film 305, the source electrode 306, and the drain electrode 307 over the oxide semiconductor film 304; the oxide insulating film 308 over the channel protective film 305, the source electrode 306, and the drain electrode 307; and the back gate electrode 309 over the oxide insulating film 308. The back gate electrode 309 is formed to overlap with the oxide semiconductor film 304, whereby impurities such as moisture, a hydroxy group, and hydrogen which are present, for example, in the oxide semiconductor film 304, in the gate insulating film 302, at the interface between the oxide semiconductor film 304 and the gate insulating film 302 and its vicinity, or at the interface between the oxide semiconductor film 304 and the oxide insulating film 308 and its vicinity are absorbed or adsorbed by the back gate electrode 309 which has been activated; therefore, deterioration in the characteristics of the transistor due to the impurities can be prevented. In addition, impurities such as moisture and hydrogen included in the atmosphere in which the semiconductor device is placed can be prevented from being taken into the oxide semiconductor film 304.

Note that in FIG. 6B, an example in which the back gate electrode 309 covers the whole oxide semiconductor film 304 is shown; however, the present invention is not limited to this structure. Since the back gate electrode 309 covers the whole oxide semiconductor film 304, an effect of reducing the impurities in the oxide semiconductor film 304 can be enhanced. However, the above effect can be obtained also in the case where at least the entire portion serving as a channel formation region in the oxide semiconductor film 304 or part of the portion overlaps with the back gate electrode 309.

Further, the back gate electrode 309 may be electrically insulated and in a floating state, or may be in a state where the back gate electrode 309 is supplied with a potential. In the case of the latter, the back gate electrode 309 may be supplied with the same potential as the gate electrode 301, or may be supplied with a fixed potential such as a ground potential. The level of the potential supplied to the back gate electrode 309 is controlled, whereby the threshold voltage of the thin film transistor 311 can be controlled. Note that in the case where the back gate electrode 309 is formed using a metal material having low electrical conductivity such as $TiCr_2$, a conductive film having low resistance is formed in contact with the back gate electrode 309 and the combined resistance of these conductive films is low; in such a manner, increase in power consumption due to the parasitic resistance may be prevented.

The step of performing heat treatment for activating the back gate electrode 309 and the step of forming the insulating film 310 in contact with the back gate electrode 309 are successively performed without exposure to air (such a process is also referred to as successive treatment or an insitu process), whereby moisture or oxygen in an atmosphere can be prevented from being adsorbed onto the surface of or in the back gate electrode 309. As a result, the back gate electrode 309 can be kept to be activated, and the reliability of the thin film transistor 311 can be more increased.

Note that a substrate transfer step, an alignment step, a heating or cooling step, or the like may be provided between the step of performing heat treatment for activating the back gate electrode 309 and the step of forming the insulating film 310 in contact with the back gate electrode 309. Such a process is also within the scope of the successive treatment in this specification. However, the following case is not within the scope of the successive treatment in this specification: there is a step in which liquid is used, such as a cleaning step, a wet etching step, or a resist formation step between the above two steps.

Note that in this embodiment, although an example in which the back gate electrode 309 is formed using one or more metals that easily absorb or adsorb moisture, a hydroxy group, or hydrogen is described, the gate electrode 301 may be formed using one or more metals that easily absorb or adsorb moisture, a hydroxy group, or hydrogen. In this case, after the gate electrode 301 is formed, the gate electrode 301 may be subjected to heat treatment for activation under the same condition as the back gate electrode 309. The gate electrode 301 is formed using a metal having the above characteristics, whereby impurities such as moisture, a hydroxy group, or hydrogen which are present, for example, in the oxide semiconductor film 304, in the gate insulating film 302, at the interface between the oxide semiconductor film 304 and the gate insulating film 302 and its vicinity, or at the interface between the oxide semiconductor film 304 and the oxide insulating film 308 and its vicinity are absorbed or adsorbed by the gate electrode 301 which has been activated; therefore, deterioration in the characteristics of the transistor due to the impurities can be prevented.

This embodiment can be implemented in combination with another embodiment as appropriate.

Embodiment 4

In this embodiment, a method for manufacturing a semiconductor display device according to one embodiment of the present invention will be described with reference to FIGS. 7A to 7C, FIGS. 8A to 8C, FIGS. 9A to 9C, FIG. 10, FIG. 11, FIG. 12, and FIG. 13.

Figure 7A:
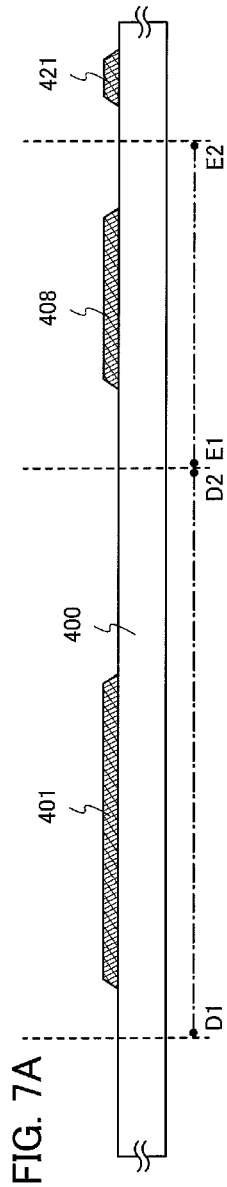
FIGS. 7A to 7C illustrate a method for manufacturing a semiconductor device.

In FIG. 7A, as a substrate 400 having a light-transmitting property, any of a variety of glass substrates that are used in the electronics industry such as aluminosilicate glass, barium borosilicate glass, and aluminoborosilicate glass can be used. A substrate formed from a flexible synthetic resin, such as plastic, generally tends to have a low upper temperature limit, but can be used as the substrate 400 as long as the substrate can withstand processing temperatures in the manufacturing process performed later. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

Next, a conductive film is formed over an entire surface of the substrate 400, and then a first photolithography step is performed. A resist mask is formed, and then an unnecessary portion is removed by etching, so that wirings and electrodes (a gate wiring including a gate electrode 401, a capacitor wiring 408, and a first terminal 421) are formed. At this time, the etching is performed so that at least an end portion of the gate electrode 401 has a tapered shape.

The conductive film can be formed to have a single-layer structure or a stacked-layer structure using a metal material such as molybdenum, titanium, chromium, tantalum, tungsten, neodymium, or scandium; an alloy material which contains any of these metal materials as its main component; or a nitride which contains any of these metals. Note that for the conductive film, aluminum or copper can also be used as the above metal material as long as it can withstand the temperature of heat treatment performed later.

For example, as a two-layer structure of the conductive film, a two-layer structure in which a titanium nitride film and a molybdenum film are stacked is preferable. As a three-layer structure of the conductive film, a three-layer structure in which a tungsten film or a tungsten nitride film, an aluminum-silicon alloy film or an aluminum-titanium alloy film, and a titanium nitride film or a titanium film are stacked is preferable.

Figure 7B:
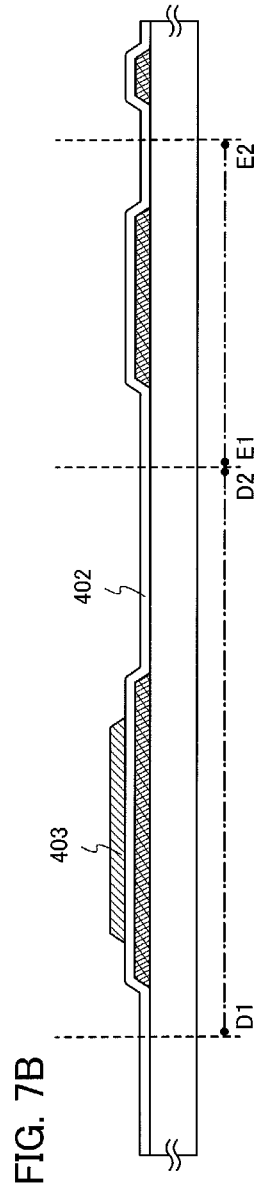

Next, as illustrated in FIG. 7B, a gate insulating film 402 is formed over the gate electrode 401, the capacitor wiring 408, and the first terminal 421. The gate insulating film 402 is formed to a thickness of 50 nm to 250 nm by a sputtering method, a PCVD method, or the like.

For example, as the gate insulating film 402, a silicon oxide film is formed to a thickness of 100 nm by a sputtering method. Needless to say, the gate insulating film 402 is not necessarily formed using such a silicon oxide film and may be formed to have a single-layer structure or a stacked-layer structure using another insulating film such as a silicon oxynitride film, a silicon nitride film, an aluminum oxide film, a tantalum oxide film, or the like.

Next, an island-shaped oxide semiconductor film (an In—Ga—Zn—O-based non-single-crystal film) 403 is formed over the gate insulating film 402. It is effective to form the In—Ga—Zn—O-based non-single-crystal film without exposure to air after the plasma treatment because dust and moisture do not adhere to the interface between the gate insulating film 402 and the oxide semiconductor film 403. Here, the oxide semiconductor film 403 is formed in an argon atmosphere, an oxygen atmosphere, or an atmosphere including both argon and oxygen under the conditions where the target is an oxide semiconductor target including In, Ga, and Zn (an In—Ga—Zn—O-based oxide semiconductor target ($In_2O_3$:$Ga_2O_3$:ZnO=1:1:1)) with a diameter of 8 inches, the distance between the substrate 400 and the target is set to 170 mm, the pressure is set at 0.4 Pa, and the direct current (DC) power supply is set at 0.5 kW. Note that a pulse direct current (DC) power supply is preferable because dust can be reduced and the film thickness can be uniform. The In—Ga—Zn—O-based non-single-crystal film is formed to have a thickness of 5 nm to 200 nm. In this embodiment, as the oxide semiconductor film 403, for example, a 50-nm-thick In—Ga—Zn—O-based non-single-crystal film is formed by a sputtering method using an In—Ga—Zn—O-based oxide semiconductor target.

The oxide semiconductor film 403 for forming a channel formation region may be formed using an oxide material having semiconductor characteristics described above.

Examples of the sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is a multi-source sputtering apparatus in which a plurality of targets of different materials can be set.

With the multi-source sputtering apparatus, films of different materials can be formed to be stacked in the same chamber, or a film of plural kinds of materials can be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method using sputtering, there are also a reactive sputtering method in which a target substance and a sputtering gas component are chemically reacted with each other during deposition to form a thin compound film thereof, and a bias sputtering in which a voltage is also applied to a substrate during deposition.

Next, a second photolithography step is performed. A resist mask is formed, and then the oxide semiconductor film is etched so that the shape of the island-shaped oxide semiconductor film 403 can be processed. For example, an unnecessary portion is removed by wet etching using a mixed solution of phosphoric acid, acetic acid, and nitric acid, so that the island-shaped oxide semiconductor film 403 is formed to overlap with the gate electrode 401. Note that etching here is not limited to wet etching, and dry etching may also be performed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method, an ICP (inductively coupled plasma) etching method, or the like can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, ITO-07N (produced by KANTO CHEMICAL CO., INC.) may be used.

The etchant used in the wet etching is removed by cleaning together with the material which is etched off. Waste liquid of the etchant containing the removed material may be purified and the material contained in the waste liquid may be reused. When a material such as indium included in the oxide semiconductor film is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, the oxide semiconductor film 403 is subjected to heat treatment under a reduced-pressure atmosphere, an inert gas atmosphere such as a nitrogen atmosphere or a rare gas atmosphere, an oxygen atmosphere, or an ultra-dry air (i.e., air having a moisture content of 20 ppm (−55° C. by dew-point conversion) or less, preferably 1 ppm or less, more preferably 10 ppb or less in the case where the measurement is performed with use of a CRDS (cavity-ring-down spectroscopy) type dew-point meter) atmosphere, whereby an oxide semiconductor film 404 is formed. Specifically, the island-shaped oxide semiconductor film 403 is subjected to heat treatment at higher than or equal to 400° C. and lower than or equal to 700° C., preferably higher than or equal to 450° C. and lower than or equal to 650° C. under an inert gas (such as nitrogen, helium, neon, or argon) atmosphere. Then, the heated island-shaped oxide semiconductor film is slowly cooled to a temperature which is higher than or equal to room temperature and less than 100° C. under an inert atmosphere. By heat treatment performed on the oxide semiconductor film 403 under the above-described atmosphere, moisture, hydrogen, and a hydroxy group included in the oxide semiconductor film 403 are eliminated. Therefore, deterioration in characteristics of a thin film transistor in which the oxide semiconductor film 404 serves as a channel formation region due to the above impurities can be prevented.

For the heat treatment, a heating method using an electric furnace or an instantaneous heating method such as a gas rapid thermal anneal (GRTA) method using a heated gas or a lamp rapid thermal anneal (LRTA) method using lamp light can be used. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

Note that in the heat treatment, it is preferable that moisture, hydrogen, and the like be not contained in nitrogen or a rare gas such as helium, neon, or argon. Alternatively, it is preferable that nitrogen or a rare gas such as helium, neon, or argon introduced into an apparatus for heat treatment have a purity of 6N (99.9999%) or more, preferably, 7N (99.99999%) or more (that is, the impurity concentration is set to 1 ppm or lower, preferably, 0.1 ppm or lower).

Alternatively, the heat treatment may be performed under air where the dew point under an atmospheric pressure is −60° C. or lower and the moisture content is small, instead of an inert gas atmosphere such as a nitrogen atmosphere or a rare gas atmosphere.

The island-shaped oxide semiconductor film 404 which is formed through the heat treatment under an inert gas atmosphere may be partially crystallized.

Note that after the heat treatment is performed on the oxide semiconductor film 404, heat treatment is performed on the oxide semiconductor film 404 under an oxygen atmosphere, whereby impurities such as moisture included in the oxide semiconductor film 404 can be removed. In addition, the heat treatment is performed under an oxygen atmosphere in order that the oxide semiconductor film 404 may include excessive oxygen, whereby resistance thereof can be increased. The heat treatment is performed at a temperature where a metal having a low melting point such as Zn included in the oxide semiconductor is less likely to be evaporated, for example, higher than or equal to 100° C. and lower than 350° C., preferably higher than or equal to 150° C. and lower than 250° C. It is preferable that an oxygen gas used for the heat treatment under an oxygen atmosphere do not include moisture, hydrogen, or the like. Alternatively, an oxygen gas which is introduced into the heat treatment apparatus preferably has a purity of 6N (99.9999%) or more, more preferably 7N (99.99999%) or more (that is, the impurity concentration in oxygen is 1 ppm or lower, preferably 0.1 ppm or lower).

Figure 7C:
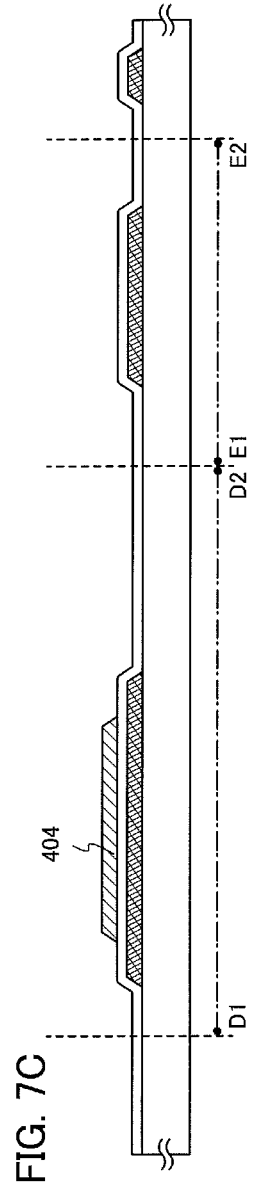

Cross-sectional views taken along dashed lines D1-D2 and E1-E2 in FIG. 7C correspond to cross-sectional views taken along dashed lines D1-D2 and E1-E2 in a plan view illustrated in FIG. 10, respectively.

Next, as illustrated in FIG. 8A, a conductive film 406 is formed using a metal material over the oxide semiconductor film 404 by a sputtering method or a vacuum evaporation method. As a material of the conductive film 406, an element selected from chromium, tantalum, titanium, molybdenum, tungsten, zirconium, beryllium, thorium, manganese, or magnesium, an alloy containing one or more of these elements as its component, or the like can be given. In order to further improve heat resistance to heat treatment which is to be performed after a source electrode 407a and a drain electrode 407b are formed, the conductive film 406 may be formed in combination of the above material with a heat resistant conductive material such as neodymium, scandium, or a nitride of these elements.

Next, a third photolithography step is performed. A resist mask is formed, and unnecessary portions are removed by etching, so that the source electrode 407a, the drain electrode 407b, and a second terminal 420 are formed as illustrated in FIG. 8B. Wet etching or dry etching is employed as an etching method at this time. For example, when a molybdenum film is used as the conductive film 406, wet etching using a solution including phosphoric acid as an etchant can be carried out.

In this etching step, an exposed region of the oxide semiconductor film 404 is also partly etched in some cases. In this case, an oxide semiconductor film 409 has a region whose thickness is small between the source electrode 407a and the drain electrode 407b.

In this third photolithography step, the second terminal 420 which is formed using the same material as the source electrode 407a or the drain electrode 407b is left in a terminal portion. Note that the second terminal 420 is electrically connected to a source wiring (a source wiring including the source electrode 407a or the drain electrode 407b).

Further, by use of a resist mask having regions with plural thicknesses (e.g., two different thicknesses) which is formed using a multi-tone mask, the number of resist masks can be reduced, resulting in simplified process and lower costs.

Next, the resist mask is removed, and then, the oxide semiconductor film 409 may be again subjected to heat treatment under a reduced-pressure atmosphere, an inert gas atmosphere such as a nitrogen atmosphere or a rare gas atmosphere, an oxygen atmosphere, or an ultra-dry air (i.e., air having a moisture content of 20 ppm (−55° C. by dew-point conversion) or less, preferably 1 ppm or less, more preferably 10 ppb or less in the case where the measurement is performed with use of a CRDS (cavity-ring-down spectroscopy) type dew-point meter) atmosphere in order to eliminate moisture, hydrogen, and a hydroxy group included in the oxide semiconductor film 409. In consideration of heat resistance of the source electrode 407a and the drain electrode 407b, the heat treatment after the source electrode 407a and the drain electrode 407b are formed is preferably performed at a temperature lower than the temperature of the heat treatment before the source electrode 407a and the drain electrode 407b are formed. Specifically, the heat treatment after the source electrode 407a and the drain electrode 407b are formed may be performed at higher than or equal to 350° C. and lower than or equal to 650° C., preferably higher than or equal to 400° C. and lower than or equal to 600° C.

Figure 11:
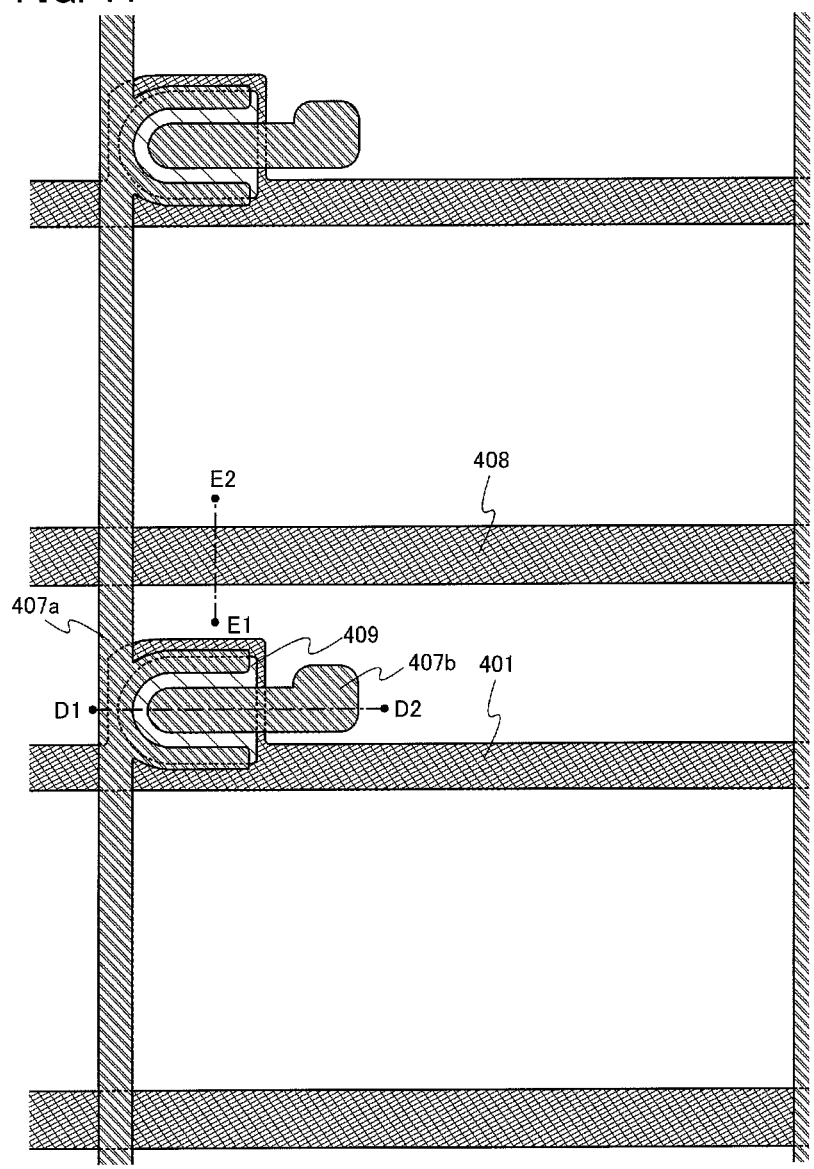
FIG. 11 illustrates a method for manufacturing a semiconductor device.

Cross-sectional views taken along dashed lines D1-D2 and E1-E2 in FIG. 8B correspond to cross-sectional views taken along dashed lines D1-D2 and E1-E2 in a plan view illustrated in FIG. 11, respectively.

Next, as illustrated in FIG. 8C, an oxide insulating film 411 which covers the gate insulating film 402, the oxide semiconductor film 409, the source electrode 407a, and the drain electrode 407b is formed. The oxide insulating film 411 is formed using a silicon oxynitride film by a PCVD method. The oxide insulating film 411 which is a silicon oxynitride film and an exposed region of the oxide semiconductor film 409 which is provided between the source electrode 407a and the drain electrode 407b are in contact with each other, whereby the resistance of a region of the oxide semiconductor film 409 in contact with the oxide insulating film 411 is increased (i.e., the carrier concentration is reduced, preferably to lower than $1 \times 10^{18}/cm^3$). Thus, a high-resistance channel formation region can be formed.

Heat treatment may be performed after formation of the oxide insulating film 411. The treatment may be performed in an air atmosphere or a nitrogen atmosphere at higher than or equal to 350° C. and lower than or equal to 650° C., preferably higher than or equal to 400° C. and lower than or equal to 600° C. In such heat treatment, the oxide semiconductor film 409 in the state of being in contact with the oxide insulating film 411 is heated, which leads to increase in resistance of the oxide semiconductor film 409; thus, electric characteristics of the transistor can be improved and variation in electric characteristics can be reduced. There is no particular limitation on the timing of the heat treatment as long as it is performed after the oxide insulating film 411 is formed. When this heat treatment also serves as heat treatment in another step, e.g., heat treatment in formation of a resin film or heat treatment for reducing resistance of a transparent conductive film, the number of steps can be prevented from increasing.

Next, as illustrated in FIG. 9A, a conductive film is formed over the oxide insulating film 411 with use of one or more metals that easily absorb or adsorb moisture, a hydroxy group, or hydrogen, and then, the conductive film is patterned, whereby a back gate electrode 412 is formed to overlap with the oxide semiconductor film 409. Specifically, as the metal having such characteristics, titanium, platinum, vanadium, zirconium, hafnium, palladium, magnesium, niobium, a rare earth metal, or the like can be given. As the rare earth metal, an alloy including cerium (40% to 50%), lanthanum (20% to 40%), and a rare earth metal such as praseodymium, neodymium, or yttrium, which is called a misch metal (Mm), can also be used. The back gate electrode 412 may be a mixture, a metal compound, or an alloy which includes one or more of the above metals.

As the alloy used for the back gate electrode 412, an alloy called a hydrogen absorbing alloy can also be given. As the hydrogen absorbing alloy, for example, an $AB_5$ alloy, an $AB_2$ (Laves phase) alloy, an $A_2B$ alloy, or the like can be given. In the $AB_5$ alloy, one or more of a rare earth metal, niobium, and zirconium are included in A site, and one or more transition metals having a catalytic effect such as nickel, cobalt, aluminum, and tin are included in B site. As the rare earth metal, a misch metal can also be used. As the $AB_5$ alloy, for example, $LaNi_5$ or the like can be used for the back gate electrode 412. In the $AB_2$ (Laves phase) alloy, one or more of titanium, zirconium, and hafnium are included in A site, and one or more transition metals such as manganese, nickel, chromium, and vanadium are included in B site; for example, a Ti—Mn-based alloy, a Ti—Cr-based alloy, a Zr—Mn-based alloy, a Ti—V—Mn-based alloy, or the like can be given. As the $AB_2$ alloy, for example, $TiCr_2$, $TiMn_2$, or the like can be used for the back gate electrode 412. In the $A_2B$ alloy, one or more of magnesium and titanium are included in A site, and one or more of nickel and copper are included in B site. As the $A_2B$ alloy, for example, $Mg_2Ni$, $Mg_2Cu$, $Ti_2Ni$, or the like can be used for the back gate electrode 412. Note that in these hydrogen absorbing alloys, at least part of an element in A site or B site can be replaced with another element, and the actual composition is not necessarily in due form. As the hydrogen absorbing alloy, in addition to the above type alloys, a Ti—Fe alloy, a V-type alloy, a Pd-type alloy, a Ca-type alloy, a BCC alloy, or the like can be used for the back gate electrode 412.

The thickness of the back gate electrode 412 is set to 10 nm to 400 nm, preferably 100 nm to 200 nm. In this embodiment, a conductive film of 200 nm thick is formed using $TiCr_2$ by a sputtering method under the following conditions: an alloy that is a target (φ:6 inches) whose composition ratio of titanium to chromium is 1:2 is used; an argon gas is introduced into a chamber with a flow rate of 50 sccm; the pressure is 0.4 Pa; the electric power is 2 kW; and the film formation temperature is room temperature. Then, a photolithography step is performed. A resist mask is formed, and an unnecessary portion is removed by plasma etching with use of chlorine and oxygen as an etching gas so that the conductive film is processed (patterned) into a desired shape; in such a manner, the back gate electrode 412 is formed.

Next, after the back gate electrode 412 is formed, heat treatment is performed under a reduced-pressure atmosphere or an inert gas atmosphere in the state where the back gate electrode 412 is exposed, whereby activation treatment for removing moisture, oxygen, hydrogen, or the like adsorbed onto a surface of or in the back gate electrode 412 is performed. In consideration of the heat resistance of the source electrode 407a and the drain electrode 407b, the heat treatment is preferably performed at a temperature lower than the temperature of the heat treatment before the source electrode 407a and the drain electrode 407b are formed. Specifically, the heat treatment is performed at higher than or equal to 300° C. and lower than or equal to 650° C., preferably higher than or equal to 350° C. and lower than or equal to 600° C.

By the activation treatment, impurities such as moisture, a hydroxy group, or hydrogen which are present, for example, in the oxide semiconductor film 409, in the gate insulating film 402, at the interface between the oxide semiconductor film 409 and the gate insulating film 402 and its vicinity, or at the interface between the oxide semiconductor film 409 and the oxide insulating film 411 and its vicinity are absorbed or adsorbed by the back gate electrode 412 which has been activated; therefore, deterioration in the characteristics of the transistor due to the impurities can be prevented.

In addition, impurities such as moisture or hydrogen included in an atmosphere in which the semiconductor device is placed can be prevented from being taken into the oxide semiconductor film 409.

In this embodiment, heat treatment is performed for 10 minutes in the state where the substrate temperature reaches 400° C. and a treatment chamber is kept to a reduced-pressure atmosphere having a degree of vacuum of $5 \times 10^{-3}$ Pa or less, preferably $10^{-5}$ Pa or less by an evacuation unit such as a turbo molecular pump. For the heat treatment, a heating method using an electric furnace or an instantaneous heating method such as a gas rapid thermal anneal (GRTA) method using a heated gas or a lamp rapid thermal anneal (LRTA) method using lamp light can be used. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

Note that heat treatment for activation is performed in the state where the oxide semiconductor film 409 is in contact with the oxide insulating film 411. Therefore, a region of the oxide semiconductor film 409 in contact with the oxide insulating film 411 uniformly has higher resistance; thus, variation in electric characteristics of a thin film transistor 414 can be reduced.

Next, after the activation treatment is performed, an insulating film 413 is formed so as to cover the back gate electrode 412 as illustrated in FIG. 9B. The insulating film 413 is preferably formed using a material having a high barrier property so that moisture and oxygen in the atmosphere are prevented from being adsorbed onto the surface of or in the back gate electrode 412. For example, the insulating film 413 can be formed to have a single-layer structure or a stacked-layer structure of a silicon nitride film, a silicon nitride oxide film, an aluminum nitride film, or an aluminum nitride oxide film, or the like, as an insulating film having a high barrier property, by a plasma CVD method, a sputtering method, or the like. In order to obtain an effect of a barrier property, the insulating film 413 is preferably formed to a thickness of 15 nm to 400 nm, for example.

In this embodiment, the insulating film 413 is formed to a thickness of 300 nm by a plasma CVD method. The insulating film 413 is formed under the following conditions: the flow rate of a silane gas is 4 sccm; the flow rate of dinitrogen monoxide ($N_2O$) is 800 sccm; and the substrate temperature is 400° C.

By the formation of the insulating film 413, moisture and oxygen in the atmosphere can be prevented from being adsorbed onto the surface of or in the back gate electrode 412; therefore, the back gate electrode 412 can be kept to be activated, and reliability of the transistor can be increased.

Figure 12:
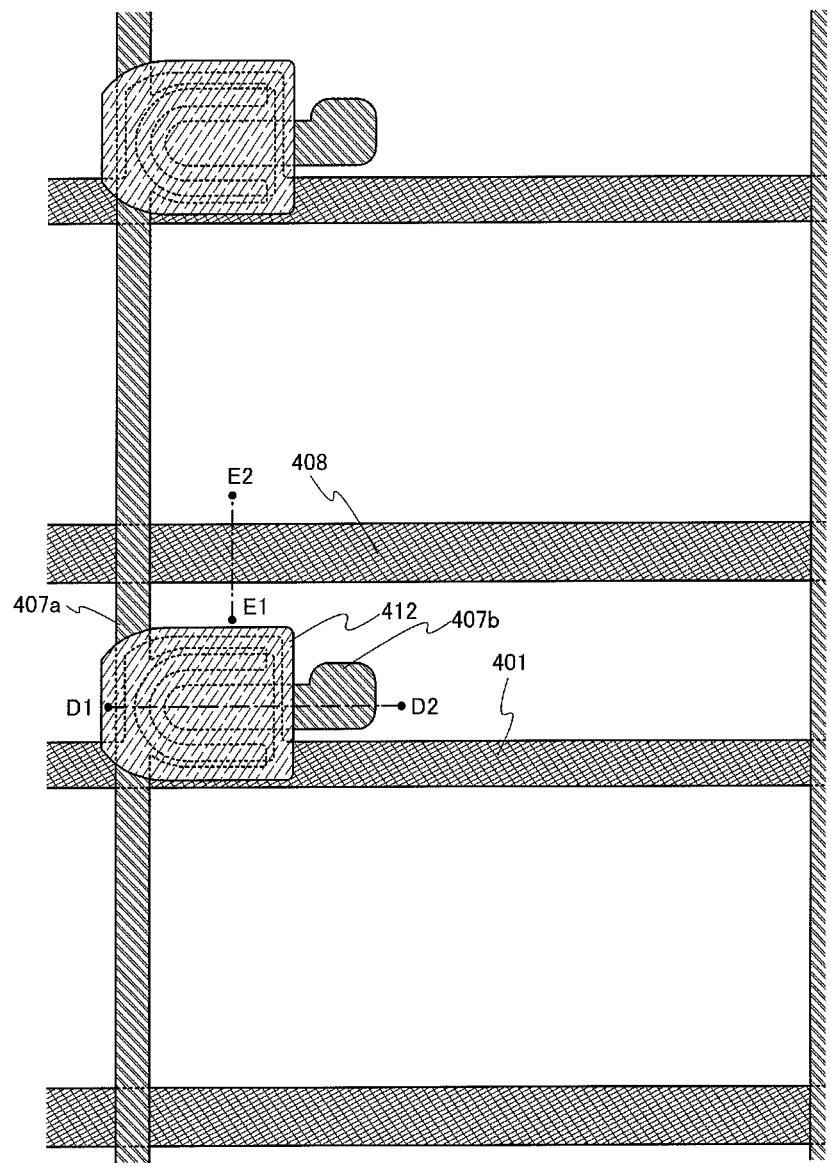
FIG. 12 illustrates a method for manufacturing a semiconductor device.
Figure 13:
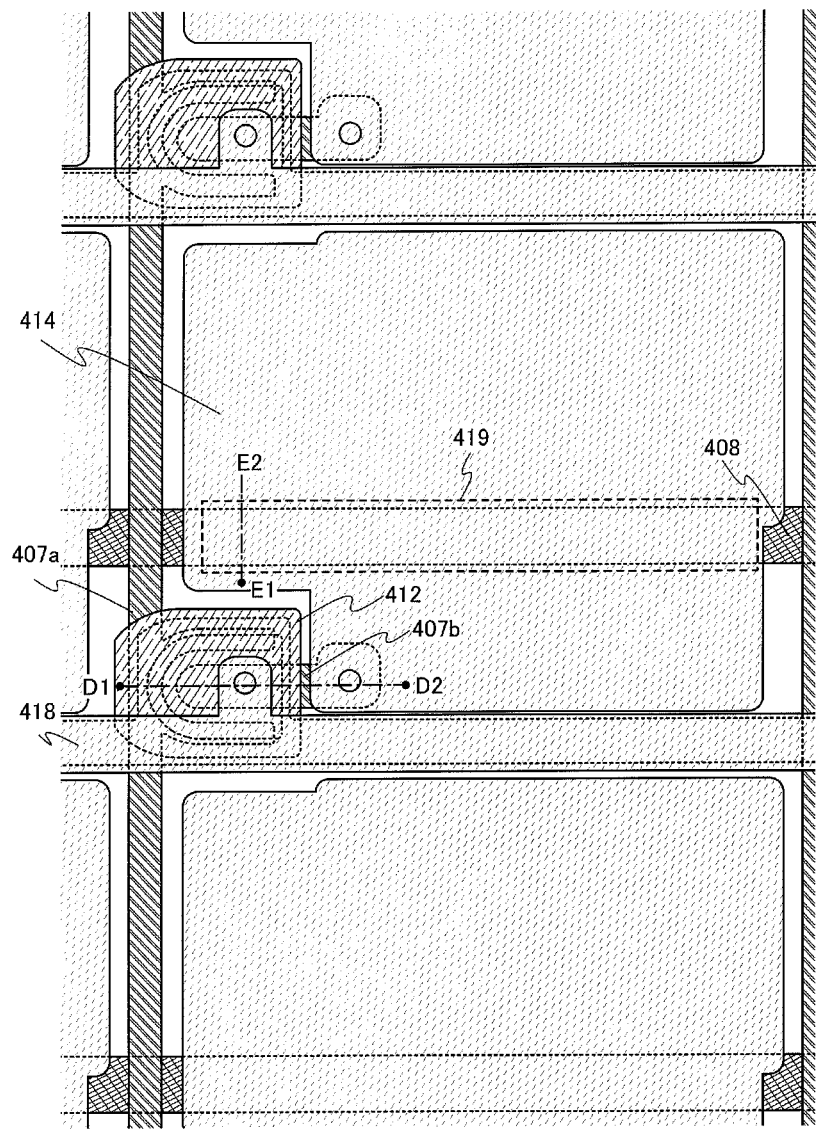
FIG. 13 illustrates a method for manufacturing a semiconductor device.

Cross-sectional views taken along dashed lines D1-D2 and E1-E2 in FIG. 9B correspond to cross-sectional views taken along dashed lines D1-D2 and E1-E2 in a plan view illustrated in FIG. 12, respectively.

Through the above steps, the thin film transistor 414 can be manufactured.

Next, a fourth photolithography step is performed. A resist mask is formed, and the gate insulating film 402, the oxide insulating film 411, and the insulating film 413 are etched, so that contact holes are formed to expose part of the drain electrode 407b, part of the first terminal 421, part of the second terminal 420, and part of the back gate electrode 412. Next, the resist mask is removed, and then a transparent conductive film is formed. The transparent conductive film is formed of indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—$ZnO$) may be used to improve etching processability. Further, when heat treatment for reducing resistance of the transparent conductive film is performed, the heat treatment can also serve as heat treatment for increasing resistance of the oxide semiconductor film 409, which results in improvement of electric characteristics of the transistor and reduction of variation in the electric characteristics thereof.

Next, a fifth photolithography step is performed. A resist mask is formed and an unnecessary portion is removed by etching, so that a pixel electrode 415 which is connected to the drain electrode 407b, a transparent conductive film 416 which is connected to the first terminal 421, a transparent conductive film 417 which is connected to the second terminal 420, and a transparent conductive film 418 which is connected to the back gate electrode 412 are formed.

The transparent conductive films 416 and 417 function as electrodes or wirings connected to an FPC. The transparent conductive film 416 formed over the first terminal 421 is a connection terminal electrode which functions as an input terminal of the gate wiring. The transparent conductive film 417 formed over the second terminal 420 is a connection terminal electrode which functions as an input terminal of the source wiring. The transparent conductive film 418 is a wiring for supplying the back gate electrode 412 with a power supply potential.

In this fifth photolithography step, a storage capacitor 419 is formed with the capacitor wiring 408 and the pixel electrode 415, in which the gate insulating film 402, the oxide insulating film 411, and the insulating film 413 are used as dielectrics.

Cross-sectional views after the resist mask is removed are illustrated in FIG. 9C. Cross-sectional views taken along dashed lines D1-D2 and E1-E2 in FIG. 9C correspond to cross-sectional views taken along dashed lines D1-D2 and E1-E2 in a plan view illustrated in FIG. 13, respectively.

Through these five photolithography steps, the storage capacitor 419 and the thin film transistor 414 which is a bottom-gate staggered thin film transistor can be completed using the five photomasks. By disposing the thin film transistor and the storage capacitor in each pixel in a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween.

Instead of providing the capacitor wiring, the pixel electrode may be overlapped with a gate wiring of an adjacent pixel with the oxide insulating film and the gate insulating film interposed therebetween, to form a storage capacitor.

In an active matrix liquid crystal display device, pixel electrodes arranged in a matrix form are driven, so that a display pattern is formed on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

When a light-emitting display device is manufactured, a partition formed using an organic resin film may be provided between organic light-emitting elements in some cases. In such a case, the organic resin film is subjected to heat treatment, and the heat treatment can also serve as heat treatment for increasing resistance of the oxide semiconductor film 409, which results in improvement of electric characteristics of the transistor and reduction of variation in the electric characteristics thereof.

The use of an oxide semiconductor for a thin film transistor leads to reduction in manufacturing cost. In particular, since impurities such as moisture, hydrogen, and OH can be reduced for increasing purity of the oxide semiconductor film by the heat treatment, it is not necessary to use an ultrapure oxide semiconductor target and a special sputtering apparatus provided with a deposition chamber whose dew point is lowered. Further, a semiconductor display device including a highly reliable thin film transistor with excellent electric characteristics can be manufactured.

The channel formation region in the semiconductor film is a high-resistance region; thus, electric characteristics of the thin film transistor are stabilized and increase in off current can be prevented. Therefore, a semiconductor display device including a thin film transistor having high electric characteristics and high reliability can be provided.

This embodiment can be implemented in combination with any of the above embodiments.

Embodiment 5

In this embodiment, a structure of a liquid crystal display device according to one embodiment of the present invention will be described.

Figure 14:
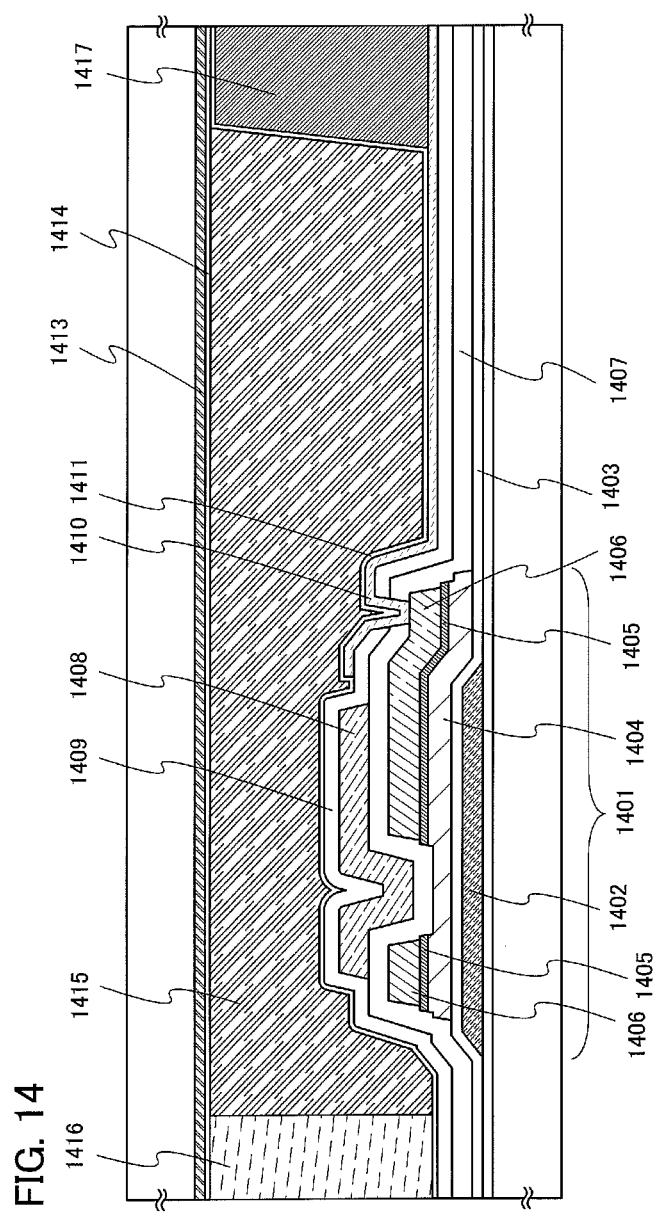
FIG. 14 is a cross-sectional view of a liquid crystal display device.

FIG. 14 illustrates a cross-sectional view of a liquid crystal display device according to one embodiment of the present invention, as an example. A thin film transistor 1401 illustrated in FIG. 14 includes a gate electrode 1402 formed on an insulating surface; a gate insulating film 1403 formed so as to cover the gate electrode 1402; an oxide semiconductor film 1404 formed so as to overlap with the gate electrode 1402 with the gate insulating film 1403 interposed therebetween; a pair of semiconductor films 1405 functioning as a source region and a drain region, which are formed over the oxide semiconductor film 1404; a pair of conductive films 1406 functioning as a source electrode and a drain electrode, which are formed over the pair of semiconductor films 1405; an oxide insulating film 1407; and a back gate electrode 1408 formed over the oxide insulating film 1407. The back gate electrode 1408 is covered with an insulating film 1409. The oxide insulating film 1407 is in contact with at least the oxide semiconductor film 1404 and formed so as to cover the gate electrode 1402, the gate insulating film 1403, the oxide semiconductor film 1404, the pair of semiconductor films 1405, and the pair of conductive films 1406.

An opening is provided in part of the oxide insulating film 1407 and the insulating film 1409, and a pixel electrode 1410 is formed so as to be in contact with one of the conductive films 1406 in the opening.

Further, a spacer 1417 for controlling a cell gap of a liquid crystal element is formed over the pixel electrode 1410. An insulating film is etched to have a desired shape, so that the spacer 1417 can be formed. A cell gap may also be controlled by dispersing a filler on the insulating film 1409.

An alignment film 1411 is formed over the pixel electrode 1410. The alignment film 1411 can be formed by subjecting an insulating film to rubbing treatment, for example. Further, a counter electrode 1413 is provided in a position opposed to the pixel electrode 1410, and an alignment film 1414 is formed on the side of the counter electrode 1413, which is close to the pixel electrode 1410. Furthermore, a liquid crystal 1415 is provided in a region which is surrounded by a sealant 1416 between the pixel electrode 1410 and the counter electrode 1413. Note that a filler may be mixed in the sealant 1416.

The pixel electrode 1410 and the counter electrode 1413 can be formed using a transparent conductive material such as indium tin oxide including silicon oxide (ITSO), indium tin oxide (ITO), zinc oxide (ZnO), indium zinc oxide (IZO), or gallium-doped zinc oxide (GZO), for example. Note that this embodiment describes an example of manufacturing a transmissive type liquid crystal element by using a light-transmitting conductive film for the pixel electrode 1410 and the counter electrode 1413. However, the present invention is not limited to this structure. The liquid crystal display device according to one embodiment of the present invention may be a semi-transmissive type liquid crystal display device or a reflective type liquid crystal display device.

The liquid crystal display device illustrated in FIG. 14 may be provided with a color filter, a shielding film (a black matrix) for preventing disclination (a black matrix), or the like.

Although a liquid crystal display device of a TN (twisted nematic) mode is described in this embodiment, the thin film transistor of the present invention can be used for other liquid crystal display devices of a VA (vertical alignment) mode, an OCB (optically compensated birefringence) mode, an IPS (in-plane-switching) mode, and the like.

The liquid crystal display device according to one embodiment of the present invention has high reliability.

This embodiment can be implemented in combination with another embodiment as appropriate.

Embodiment 6

In this embodiment, a structure of a light-emitting device including the thin film transistor according to one embodiment of the present invention for a pixel will be described. In this embodiment, a cross-sectional structure of a pixel in the case where a transistor for driving a light-emitting element is an n-channel transistor is described with reference to FIGS. 15A to 15C. Note that FIGS. 15A to 15C illustrate the case where a first electrode is a cathode and a second electrode is an anode; however, the first electrode may be an anode and the second electrode may be a cathode.

Figure 15A:
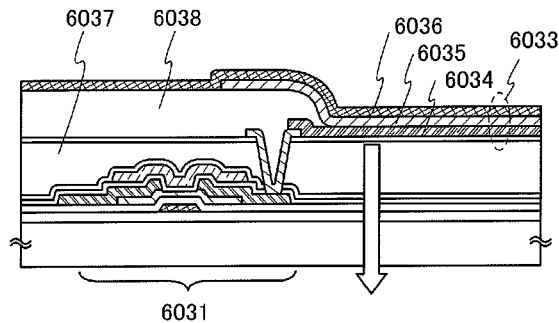
FIGS. 15A to 15C are cross-sectional views of light-emitting devices.
Figure 15B:
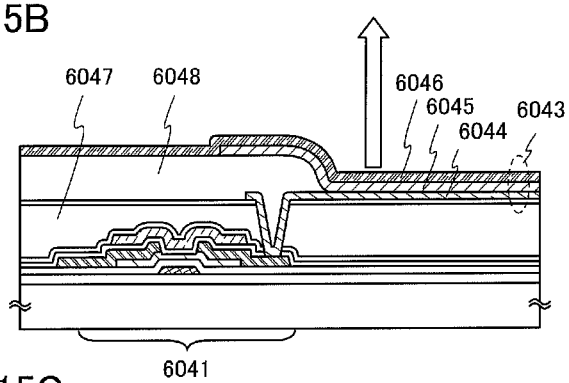
Figure 15C:
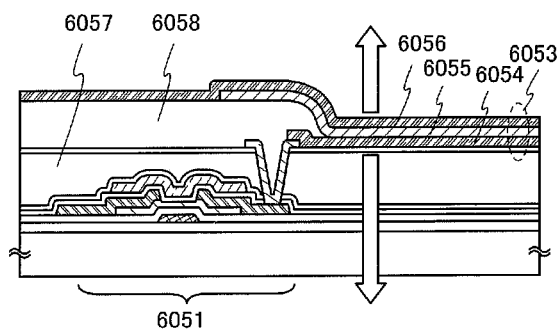

A cross-sectional view of a pixel in the case where a transistor 6031 is an n-channel transistor, and light emitted from a light-emitting element 6033 is extracted from a first electrode 6034 side is illustrated in FIG. 15A. The transistor 6031 is covered with an insulating film 6037, and over the insulating film 6037, a bank 6038 having an opening is formed. In the opening of the bank 6038, the first electrode 6034 is partially exposed, and the first electrode 6034, an electroluminescent layer 6035, and a second electrode 6036 are sequentially stacked in the opening.

The first electrode 6034 is formed using such a material or to such a thickness as to transmit light, and can be formed using a metal, an alloy, an electrically conductive compound, a mixture thereof, or the like having a low work function. Specifically, an alkaline metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron-injection layer is provided, another conductive layer such as an aluminum layer may be used as well. Then, the first electrode 6034 is formed to such a thickness as to transmit light (preferably, about 5 nm 20 to 30 nm). Furthermore, the sheet resistance of the first electrode 6034 may be suppressed by formation of a light-transmitting conductive layer of a light-transmitting oxide conductive material so as to be in contact with and over or under the above-described conductive layer having such a thickness that it can transmit light. Alternatively, the first electrode 6034 may be formed of only a conductive layer of another light-transmitting oxide conductive material such as indium tin oxide (ITO), zinc oxide (ZnO), indium zinc oxide (IZO), or gallium-doped zinc oxide (GZO). Furthermore, a mixture in which zinc oxide (ZnO) is mixed at 2% to 20% in ITO, indium tin oxide including silicon oxide (hereinafter referred to as ITSO), or indium oxide including silicon oxide may be used as well. In the case of using the light-transmitting oxide conductive material, it is preferable to provide an electron-injection layer in the electroluminescent layer 6035.

The second electrode 6036 is formed using such a material and to such a thickness as to reflect or shield light, and formed using a material suitable for being used as an anode. For example, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6036.

The electroluminescent layer 6035 is formed with a single layer or a plurality of layers. When the electroluminescent layer 6035 is formed with a plurality of layers, these layers can be classified into a hole-injection layer, a hole-transport layer, a light-emitting layer, an electron-transport layer, an electron-injection layer, and the like in view of the carrier-transport property. However, in the case where the electroluminescent layer 6035 has any of a hole-injection layer, a hole-transport layer, an electron-transport layer, and an electron-injection layer in addition to the light-emitting layer, the electron-injection layer, the electron-transport layer, the light-emitting layer, the hole-transport layer, and the hole-injection layer are sequentially stacked from the first electrode 6034. Note that the boundary between the layers is not necessarily clear, and there may be the case where the boundary is unclear since materials for forming the layers are partially mixed with each other. Each layer may be formed with an organic material or an inorganic material. As an organic material, any of a high molecular weight organic material, a medium molecular weight organic material, and a low molecular weight organic material may be used. Note that a medium molecular weight organic material corresponds to a low polymer in which the number of repetitions of a structural unit (the degree of polymerization) is about 2 to 20. There is no clear distinction between a hole-injection layer and a hole-transport layer, and the hole-injection layer and the hole-transport layer are the same in a sense that a hole-transport property (hole mobility) is an especially important characteristic. A layer being in contact with the anode is referred to as a hole-injection layer and a layer being in contact with the hole-injection layer is referred to as a hole-transport layer for convenience. The same is also true for the electron-transport layer and the electron-injection layer; a layer being in contact with the cathode is referred to as an electron-injection layer and a layer being in contact with the electron-injection layer is referred to as an electron transport-layer. In some cases, the light-emitting layer also functions as the electron-transport layer, and it is therefore referred to as a light-emitting electron-transport layer, too.

In the case of the pixel illustrated in FIG. 15A, light emitted from the light-emitting element 6033 can be extracted from the first electrode 6034 side as shown by a hollow arrow.

Next, a cross-sectional view of a pixel in the case where a transistor 6041 is an n-channel transistor, and light emitted from a light-emitting element 6043 is extracted from a second electrode 6046 side is illustrated in FIG. 15B. The transistor 6041 is covered with an insulating film 6047, and over the insulating film 6047, a bank 6048 having an opening is formed. In the opening of the bank 6048, a first electrode 6044 is partially exposed, and the first electrode 6044, an electroluminescent layer 6045, and the second electrode 6046 are sequentially stacked in the opening.

The first electrode 6044 is formed using such a material or to such a thickness as to reflect or shield light, and can be formed using a metal, an alloy, an electrically conductive compound, a mixture thereof, or the like having a low work function. Specifically, an alkaline metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron-injection layer is provided, another conductive layer such as an aluminum layer may be used as well.

The second electrode 6046 is formed using such a material or to such a thickness as to transmit light, and formed using a material suitable for being used as an anode. For example, another light-transmitting oxide conductive material such as indium tin oxide (ITO), zinc oxide (ZnO), indium zinc oxide (IZO), or gallium-doped zinc oxide (GZO) can be used for the second electrode 6046. Further, a mixture in which zinc oxide (ZnO) is mixed at 2% to 20% in ITO, ITSO, or indium oxide including silicon oxide may be used as well for the second electrode 6046. Furthermore, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6046. However, in the case of using a material other than the light-transmitting oxide conductive material, the second electrode 6046 is formed to such a thickness as to transmit light (preferably, about 5 nm to 30 nm).

The electroluminescent layer 6045 can be formed in a manner similar to that of the electroluminescent layer 6035 of FIG. 15A.

In the case of the pixel illustrated in FIG. 15B, light emitted from the light-emitting element 6043 can be extracted from the second electrode 6046 side as shown by a hollow arrow.

Next, a cross-sectional view of a pixel in the case where a transistor 6051 is an n-channel transistor, and light emitted from a light-emitting element 6053 is extracted from a first electrode 6054 side and a second electrode 6056 side is illustrated in FIG. 15C. The transistor 6051 is covered with an insulating film 6057, and over the insulating film 6057, a bank 6058 having an opening is formed. In the opening of the bank 6058, the first electrode 6054 is partially exposed, and the first electrode 6054, an electroluminescent layer 6055, and the second electrode 6056 are sequentially stacked in the opening.

The first electrode 6054 can be formed in a manner similar to that of the first electrode 6034 of FIG. 15A. The second electrode 6056 can be formed in a manner similar to that of the second electrode 6046 of FIG. 15B. The electroluminescent layer 6055 can be formed in a manner similar to that of the electroluminescent layer 6035 of FIG. 15A.

In the case of the pixel illustrated in FIG. 15C, light emitted from the light-emitting element 6053 can be extracted from the first electrode 6054 side and the second electrode 6056 side as shown by hollow arrows.

This embodiment can be implemented in combination with another embodiment as appropriate.

Embodiment 7

In this embodiment, a structure of a liquid crystal display device according to one embodiment of the present invention will be described.

FIG. 16 illustrates an example of a perspective view showing a structure of a liquid crystal display device of the present invention. The liquid crystal display device shown in FIG. 16 is provided with a liquid crystal panel 1601 in which a liquid crystal element is formed between a pair of substrates, a first diffusing plate 1602, a prism sheet 1603, a second diffusing plate 1604, a light guide plate 1605, a reflection plate 1606, a light source 1607, and a circuit substrate 1608.

The liquid crystal panel 1601, the first diffusing plate 1602, the prism sheet 1603, the second diffusing plate 1604, the light guide plate 1605, and the reflection plate 1606 are sequentially stacked. The light source 1607 is provided at an end portion of the light guide plate 1605. The liquid crystal panel 1601 is uniformly irradiated with light from the light source 1607 which is diffused inside the light guide plate 1605 due to the first diffusing plate 1602, the prism sheet 1603, and the second diffusing plate 1604.

Although the first diffusing plate 1602 and the second diffusing plate 1604 are used in this embodiment, the number of diffusing plates is not limited to two. The number of diffusing plates may be one, or may be three or more. It is acceptable as long as the diffusing plate is provided between the light guide plate 1605 and the liquid crystal panel 1601. Therefore, a diffusing plate may be provided only on the side closer to the liquid crystal panel 1601 than the prism sheet 1603, or may be provided only on the side closer to the light guide plate 1605 than the prism sheet 1603.

Further, the cross section of the prism sheet 1603 is not limited to a sawtooth shape shown in FIG. 16. The prism sheet 1603 is acceptable as long as it has a shape with which light from the light guide plate 1605 can be concentrated on the liquid crystal panel 1601 side.

The circuit substrate 1608 is provided with a circuit which generates various kinds of signals input to the liquid crystal panel 1601, a circuit which processes the signals, or the like. In FIG. 16, the circuit substrate 1608 and the liquid crystal panel 1601 are connected to each other through an FPC (flexible printed circuit) 1609. Note that the circuit may be connected to the liquid crystal panel 1601 by using a chip on glass (COG) method, or part of the circuit may be connected to the FPC 1609 by using a chip on film (COF) method.

FIG. 16 illustrates an example in which the circuit substrate 1608 is provided with a controlling circuit which controls driving of the light source 1607 and the controlling circuit and the light source 1607 are connected to each other through an FPC 1610. Note that the above-described controlling circuit may be formed over the liquid crystal panel 1601. In that case, the liquid crystal panel 1601 and the light source 1607 are connected to each other through an FPC or the like.

Note that although FIG. 16 illustrates an edge-light type light source where the light source 1607 is provided on the edge of the liquid crystal panel 1601, a direct type light source where the light source 1607 are provided directly below the liquid crystal panel 1601 may be used.

This embodiment can be implemented in combination with any of the above embodiments as appropriate.

EXAMPLE

By using a semiconductor display device according to one embodiment of the present invention, a highly reliable electronic device can be provided.

Moreover, by using a semiconductor display device of the present invention, the heat treatment temperature in manufacturing steps can be suppressed; therefore, a highly reliable thin film transistor with excellent characteristics can be formed even when the thin film transistor is formed over a substrate formed using a flexible synthetic resin which has lower heat resistance than glass, such as plastic. Accordingly, with the use of the manufacturing method according to one embodiment of the present invention, a highly reliable, light-weight, and flexible semiconductor display device with low power consumption can be provided. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

The semiconductor display device according to one embodiment of the present invention can be used for display devices, laptops, or image reproducing devices provided with recording media (typically, devices which reproduce the content of recording media such as digital versatile discs (DVDs) and have displays for displaying the reproduced images). Besides, examples of the electronic device that can use a semiconductor display device according to one embodiment of the present invention include mobile phones, portable game machines, portable information terminals, e-book readers, cameras such as video cameras or digital still cameras, display goggles (head-mounted displays), navigation systems, audio reproducing devices (car audio systems, digital audio players, or the like), copying machines, facsimiles, printers, versatile printers, automated teller machines (ATMs), vending machines, and the like. Specific examples of these electronic devices are illustrated in FIGS. 17A to 17E.

Figure 17A:
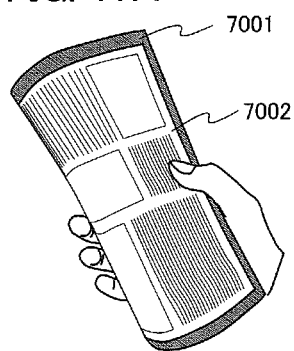
FIGS. 17A to 17E illustrate electronic devices using semiconductor devices.

FIG. 17A illustrates an e-book reader including a housing 7001, a display portion 7002, and the like. The semiconductor display device according to one embodiment of the present invention can be used for the display portion 7002. The use of the semiconductor display device according to one embodiment of the present invention for the display portion 7002 can provide a highly reliable e-book reader. Moreover, with the use of a flexible substrate, the semiconductor display device used for the display portion 7002 can have flexibility. Thus, a highly reliable, flexible, lightweight, and useful display device can be provided.

Figure 17B:
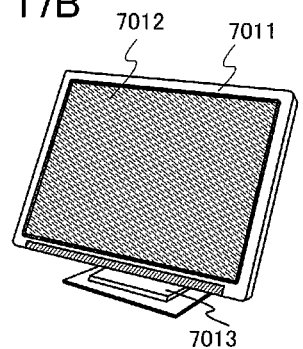

FIG. 17B illustrates a display device including a housing 7011, a display portion 7012, a supporting base 7013, and the like. The semiconductor display device according to one embodiment of the present invention can be used for the display portion 7012. The use of the semiconductor display device according to one embodiment of the present invention for the display portion 7012 can provide a highly reliable display device. Note that the display device includes all of information display devices for personal computers, TV receivers, advertisement displays, and the like.

Figure 17C:
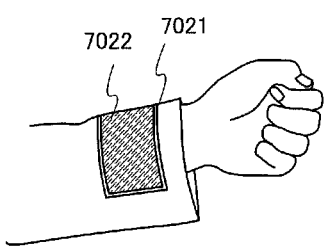

FIG. 17C illustrates a display device including a housing 7021, a display portion 7022, and the like. The semiconductor display device according to one embodiment of the present invention can be used for the display portion 7022. The use of the semiconductor display device according to one embodiment of the present invention for the display portion 7022 can provide a highly reliable display device. Moreover, with the use of a flexible substrate, the semiconductor display device, the signal processing circuit, or the like included in the display portion 7022 can have flexibility. Thus, a highly reliable, flexible, and lightweight display device can be provided. Accordingly, as illustrated in FIG. 17C, the display device can be used while being fixed to fabric or the like, and an application range of the semiconductor display device is dramatically widened.

Figure 17D:
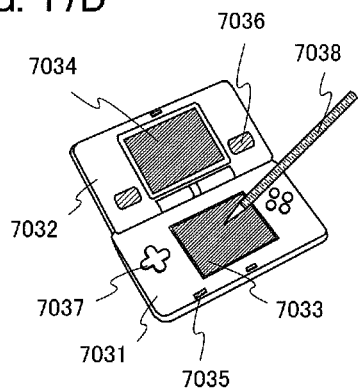

FIG. 17D illustrates a portable game machine including a housing 7031, a housing 7032, a display portion 7033, a display portion 7034, a microphone 7035, speakers 7036, an operation key 7037, a stylus 7038, and the like. The semiconductor display device according to one embodiment of the present invention can be used for the display portion 7033 and the display portion 7034. The use of the semiconductor display device according to one embodiment of the present invention for the display portion 7033 and the display portion 7034 can provide a highly reliable portable game machine. Note that although the portable game machine illustrated in FIG. 17D includes two display portions 7033 and 7034, the number of display portions included in the portable game machine is not limited to two.

Figure 17E:
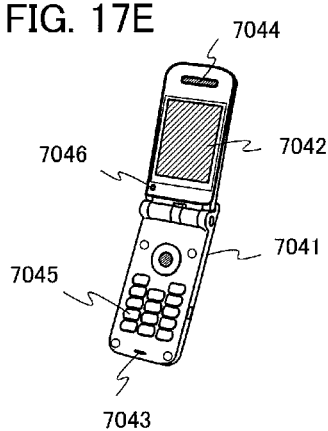

FIG. 17E illustrates a mobile phone including a housing 7041, a display portion 7042, an audio-input portion 7043, an audio-output portion 7044, operation keys 7045, a light-receiving portion 7046, and the like. Light received in the light-receiving portion 7046 is converted into electrical signals, whereby external images can be loaded. The semiconductor device according to one embodiment of the present invention can be used for the display portion 7042. The use of the semiconductor display device according to one embodiment of the present invention for the display portion 7042 can provide a highly reliable mobile phone.

This example can be implemented in combination with any of the above embodiments as appropriate.

This application is based on Japanese Patent Application serial no. 2009-229323 filed with Japan Patent Office on Oct. 1, 2009, the entire contents of which are hereby incorporated by reference.

EXPLANATION OF REFERENCE

100: substrate, 101: gate electrode, 102: gate insulating film, 103: oxide semiconductor film, 104: oxide semiconductor film, 105: source electrode, 106: drain electrode, 107: oxide semiconductor film, 108: oxide insulating film, 109: back gate electrode, 110: insulating film, 111: thin film transistor, 200: substrate, 201: gate electrode, 202: gate insulating film, 203: source electrode, 204: drain electrode, 205: oxide semiconductor film, 206: oxide semiconductor film, 207: oxide insulating film, 208: back gate electrode, 210: insulating film, 211: thin film transistor, 300: substrate, 301: gate electrode, 302: gate insulating film, 303: oxide semiconductor film, 304: oxide semiconductor film, 305: channel protective film, 306: source electrode, 307: drain electrode, 308: oxide insulating film, 309: back gate electrode, 310: insulating film, 311: thin film transistor, 400: substrate, 401: gate electrode, 402: gate insulating film, 403: oxide semiconductor film, 404: oxide semiconductor film, 406: conductive film, 408: capacitor wiring, 409: oxide semiconductor film, 411: oxide insulating film, 412: back gate electrode, 413: insulating film, 414: thin film transistor, 415: pixel electrode, 416: transparent conductive film, 417: transparent conductive film, 418: transparent conductive film, 419: storage capacitor, 420: terminal, 421: terminal, 1401: thin film transistor, 1402: gate electrode, 1403: gate insulating film, 1404: oxide semiconductor film, 1405: semiconductor film, 1406: conductive film, 1407: oxide insulating film, 1408: back gate electrode, 1409: insulating film, 1410: pixel electrode, 1411: alignment film, 1413: counter electrode, 1414: alignment film, 1415: liquid crystal, 1416: sealant, 1417: spacer, 1601: liquid crystal panel, 1602: diffusing plate, 1603: prism sheet, 1604: diffusing plate, 1605: light guide plate, 1606: reflection plate, 1607: light source, 1608: circuit substrate, 1609: FPC, 1610: FPC, 407a: source electrode, 407b: drain electrode, 6031: transistor, 6033: light-emitting element, 6034: electrode, 6035: electroluminescent layer, 6036: electrode, 6037: insulating film, 6038: bank, 6041: transistor, 6043: light-emitting element, 6044: electrode, 6045: electroluminescent layer, 6046: electrode, 6047: insulating film, 6048: bank, 6051: transistor, 6053: light-emitting element, 6054: electrode, 6055: electroluminescent layer, 6056: electrode, 6057: insulating film, 6058: bank, 7001: housing, 7002: display portion, 7011: housing, 7012: display portion, 7013: supporting base, 7021: housing, 7022: display portion, 7031: housing, 7032: housing, 7033: display portion, 7034: display portion, 7035: microphone, 7036: speaker, 7037: operation key, 7038: stylus, 7041: housing, 7042: display portion, 7043: audio-input portion, 7044: audio-output portion, 7045: operation key, and 7046: light-receiving portion

The invention claimed is:

1. A method for manufacturing a semiconductor device, comprising the steps of:
    forming a gate insulating film over a first gate electrode on an insulating surface;
    forming an oxide semiconductor film over the gate insulating film;
    forming a source electrode and a drain electrode over the oxide semiconductor film;
    forming a first insulating film over the oxide semiconductor film, the source electrode, and the drain electrode and in contact with the oxide semiconductor film;
    forming a second gate electrode over the first insulating film to overlap with a whole of the oxide semiconductor film, wherein the second gate electrode comprises a depression; and
    performing heat treatment in a state where the second gate electrode is exposed, and
    wherein the second gate electrode includes a hydrogen absorbing alloy.

2. The method for manufacturing a semiconductor device according to claim 1, wherein the heat treatment is performed at higher than or equal to 350° C. and lower than or equal to 650° C.

3. The method for manufacturing a semiconductor device according to claim 1, wherein the second gate electrode is formed using a mixture, a metal compound, or an alloy which includes one or more of titanium, platinum, vanadium, zirconium, hafnium, palladium, magnesium, niobium, or a rare earth meal.

4. The method for manufacturing a semiconductor device according to claim 1, wherein the hydrogen absorbing alloy is at least one of $LaNi_5$, a Ti—Mn-based alloy, a Ti—Cr-based alloy, a Zr—Mn-based alloy, a Ti—V—Mn-based alloy, $Mg_2Ni$, $Mg_2Cu$, and $Ti_2Ni$.

5. The method for manufacturing a semiconductor device according to claim 1, wherein the heat treatment is performed under an inert gas atmosphere or a reduced-pressure atmosphere.

6. The method for manufacturing a semiconductor device according to claim 1, wherein the first insulating film is an oxide insulating film.

7. The method for manufacturing a semiconductor device according to claim 1, further comprising the step of forming a second insulating film over the second gate electrode after the step of performing the heat treatment.

8. The method for manufacturing a semiconductor device according to claim 1, wherein the second gate electrode absorbs moisture, a hydroxy group, or hydrogen which are present in the gate insulating film, in the oxide semiconductor film, at an interface between the gate insulating film and the oxide semiconductor film, or at an interface between the oxide semiconductor film and the first insulating film by performing the heat treatment.

9. The method for manufacturing a semiconductor device according to claim 1, further comprising the step of generating plasma in vicinity a substrate to modify a surface of the gate insulating film before the oxide semiconductor film is formed.

10. A method for manufacturing a semiconductor device, comprising the steps of:
    forming a gate insulating film over a first gate electrode on an insulating surface;
    forming a source electrode and a drain electrode over the gate insulating film;
    forming an oxide semiconductor film over the source electrode and the drain electrode;
    forming a first insulating film over the oxide semiconductor film, the source electrode, and the drain electrode and in contact with the oxide semiconductor film;
    forming a second gate electrode over the first insulating film to overlap with a whole of the oxide semiconductor film, wherein the second gate electrode comprises a depression; and
    performing heat treatment in a state where the second gate electrode is exposed, and
    wherein the second gate electrode includes a hydrogen absorbing alloy.

11. The method for manufacturing a semiconductor device according to claim 10, wherein the heat treatment is performed at higher than or equal to 350° C. and lower than or equal to 650° C.

12. The method for manufacturing a semiconductor device according to claim 10, wherein the second gate electrode is formed using a mixture, a metal compound, or an alloy which includes one or more of titanium, platinum, vanadium, zirconium, hafnium, palladium, magnesium, niobium, or a rare earth meal.

13. The method for manufacturing a semiconductor device according to claim 10, wherein the hydrogen absorbing alloy is at least one of $LaNi_5$, a Ti—Mn-based alloy, a Ti—Cr-based alloy, a Zr—Mn-based alloy, a Ti—V—Mn-based alloy, $Mg_2Ni$, $Mg_2Cu$, and $Ti_2Ni$.

14. The method for manufacturing a semiconductor device according to claim 10, wherein the heat treatment is performed under an inert gas atmosphere or a reduced-pressure atmosphere.

15. The method for manufacturing a semiconductor device according to claim 10, wherein the first insulating film is an oxide insulating film.

16. The method for manufacturing a semiconductor device according to claim 10, further comprising the step of forming a second insulating film over the second gate electrode after the step of performing the heat treatment.

17. The method for manufacturing a semiconductor device according to claim 10, wherein the second gate electrode absorbs moisture, a hydroxy group, or hydrogen which are present in the gate insulating film, in the oxide semiconductor film, at an interface between the gate insulating film and the oxide semiconductor film, or at an interface between the oxide semiconductor film and the first insulating film by performing the heat treatment.

18. The method for manufacturing a semiconductor device according to claim 10, further comprising the step of generating plasma in vicinity a substrate to modify a surface of the gate insulating film before the oxide semiconductor film is formed.

19. A method for manufacturing a semiconductor device, comprising the steps of:
    forming a gate insulating film over a first gate electrode on an insulating surface;
    forming an oxide semiconductor film over the gate insulating film;

forming a channel protective film over the oxide semiconductor film;

forming a source electrode and a drain electrode over the oxide semiconductor film;

forming a first insulating film over the channel protective film, the source electrode, and the drain electrode;

forming a second gate electrode over the first insulating film to overlap with a whole of the oxide semiconductor film, wherein the second gate electrode comprises a depression; and performing heat treatment in a state where the second gate electrode is exposed, and wherein the second gate electrode includes a hydrogen absorbing alloy.

20. The method for manufacturing a semiconductor device according to claim 19, wherein the heat treatment is performed at higher than or equal to 350° C. and lower than or equal to 650° C.

21. The method for manufacturing a semiconductor device according to claim 19, wherein the second gate electrode is formed using a mixture, a metal compound, or an alloy which includes one or more of titanium, platinum, vanadium, zirconium, hafnium, palladium, magnesium, niobium, or a rare earth meal.

22. The method for manufacturing a semiconductor device according to claim 19, wherein the hydrogen absorbing alloy is at least one of $LaNi_5$, a Ti—Mn-based alloy, a Ti—Cr-based alloy, a Zr—Mn-based alloy, a Ti—V—Mn-based alloy, $Mg_2Ni$, $Mg_2Cu$, and $Ti_2Ni$.

23. The method for manufacturing a semiconductor device according to claim 19, wherein the heat treatment is performed under an inert gas atmosphere or a reduced-pressure atmosphere.

24. The method for manufacturing a semiconductor device according to claim 19, wherein the first insulating film is an oxide insulating film.

25. The method for manufacturing a semiconductor device according to claim 19, further comprising the step of forming a second insulating film over the second gate electrode after the step of performing the heat treatment.

26. The method for manufacturing a semiconductor device according to claim 19, wherein the second gate electrode absorbs moisture, a hydroxy group, or hydrogen which are present in the gate insulating film, in the oxide semiconductor film, at an interface between the gate insulating film and the oxide semiconductor film, or at an interface between the oxide semiconductor film and the first insulating film by performing the heat treatment.

27. The method for manufacturing a semiconductor device according to claim 19, further comprising the step of generating plasma in vicinity a substrate to modify a surface of the gate insulating film before the oxide semiconductor film is formed.

* * * * *